(12) United States Patent
Ohshima et al.

(10) Patent No.: US 6,222,355 B1
(45) Date of Patent: Apr. 24, 2001

(54) POWER SUPPLY CONTROL DEVICE FOR PROTECTING A LOAD AND METHOD OF CONTROLLING THE SAME

(75) Inventors: Shouzou Ohshima; Mitsugu Watanabe, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/472,871

(22) Filed: Dec. 28, 1999

(30) Foreign Application Priority Data

Dec. 28, 1998 (JP) .................................................. 10-373877
May 20, 1999 (JP) .................................................. 11-140421
Dec. 20, 1999 (JP) .................................................. 11-361483

(51) Int. Cl.[7] ...................................................... G05F 1/56
(52) U.S. Cl. ........................................... 323/282; 323/289
(58) Field of Search .................................. 323/282, 284, 323/273, 274, 313, 289

(56) References Cited

U.S. PATENT DOCUMENTS

| | | | |
|---|---|---|---|
| 4,430,608 | * 2/1984 | Nesler | 323/282 |
| 4,890,009 | * 12/1989 | Miyazaki et al. | 327/108 |
| 4,929,884 | * 5/1990 | Bird et al. | 323/313 |
| 5,998,981 | * 12/1999 | Houghton et al. | 323/282 |

* cited by examiner

*Primary Examiner*—Adolf Deneke Berhane
(74) *Attorney, Agent, or Firm*—Sughrue, Mion, Zinn, Macpeak & Seas, PLLC

(57) ABSTRACT

When the power supply from a power source 101 to a load 102 is controlled in a switching manner by a semiconductor switch QA, reference voltage generating means (QB, Rr) generates a reference voltage (VDSB) having a voltage characteristic substantially equivalent to that of a voltage between the terminals of the semiconductor switch QA being connected to a predetermined load. Detecting means CMP1 detects a difference between the voltage (VDSA) between the terminals of the semiconductor switch QA and the reference voltage (VDSB). Control means which consists of the gate driver 111 amd CMP1 performs an on/off control of the semiconductor switch QA in accordance with the difference between the voltage (VDSA) between the terminals of the semiconductor switch and the reference voltage (VDSB).

27 Claims, 18 Drawing Sheets

POWER SUPPLY CONTROL DEVICE FOR PROTECTING A LOAD AND METHOD OF CONTROLLING THE SAME

BACKGROUND OF INVENTION

1. Field of the Invention

The present invention relates to a power supply control device and a method of controlling the same. More particularly, the invention relates to a power supply control device with a semiconductor switch for controlling the supply of electric power from a power supply to a load by its switching control in response to a control signal, and a power supply control method for controlling the same.

2. Related Art

A power supply control device with a semiconductor switch as shown in FIG. 19 is known. This conventional power supply control device supplies electric power from a battery selectively to each load in a motor vehicle, and controls the power supply to the load.

As seen from the figure, the power supply control device is arranged such that a shunt resistor RS and the drain (D)—source (S) path of a thermal FET QF are connected in series in a path for applying an output voltage VB of a power source 101 to a load 102, such as head lamps and drive motors for power windows. The power supply control device includes a driver 901 for detecting a current flowing through the shunt resistor RS and controlling the drive of the thermal FET QF by a hardware circuit, an A/D converter 902 for performing an on/off control of a drive signal to the thermal FET QF in accordance with a current value monitored by the driver 901, and a microcomputer (CPU) 903.

The thermal FET QF, containing a temperature sensor (not shown) therein, has such an overheat cut-off function that when a temperature of the thermal FET QF rises to a predetermined temperature or higher, a gate cut-off circuit contained therein forcibly turns off the thermal FET QF. In the figure, RG represents a resistor RG, and ZD1 is a Zener diode which keeps a voltage across the gate (G)-source (S) path at 12V, and when an overvoltage will reach the gate G, provides a by path for the overvoltage.

The conventional power supply control device has also a protection function against an overcurrent flowing through the load 102 or the drain-source path of the thermal FET QF. The power supply control device includes a driver 901, differential amplifiers 911 and 913 as current monitoring circuits, another differential amplifier 912 as a current restriction circuit, a charge pump circuit 915, and a drive circuit 914 for driving the gate G of the thermal FET QF in accordance with an on/off control signal from the microcomputer 903 and an overcurrent judging result signal from the current restriction circuit.

When it is judged through the differential amplifier 912 that the current exceeds a judging value (upper limit) of current, by a voltage drop across the shunt resistor RS, viz., an overcurrent is detected, the drive circuit 914 turns off the thermal FET QF, and when the current decreases below a judging value (lower limit), it turns on the thermal FET QF.

The microcomputer 903 always monitors the current by use of the current monitoring circuit (differential amplifiers 911 and 913). If an abnormal current flows which is in excess of a normal current in value, it interrupts the drive signal to the thermal FET QF to turn off the thermal FET QF. Before the microcomputer 903 outputs a drive signal for an off control, when a temperature of the thermal FET QF exceeds a predetermined value of temperature, the thermal FET QF is turned off by the overheat cut-off function.

In the conventional power supply control device, the shunt resistor RS connected in series to the power supplying path is required for the current detection. The on-resistance of the recent thermal FET QF reduces, so that the load current is large. For this reason, a heat loss by the shunt resistor amounts to a quantity not negligible.

The overheat cut-off function and the overcurrent restriction circuit effectively function when a large current flows because of a dead short in the load 102 or wirings. When an imperfect short-circuit, such as a layer short-circuit, having a certain amount of short resistance occurs, and a small short-circuit current flows, the overheat cut-off function and the overcurrent restriction circuit fail to function. In this case, only one optional way permitted is that the microcomputer 903 detects an abnormal current by the current monitoring circuit and turns off the thermal FET QF. However, the control by the microcomputer has a disadvantage of slow response to the abnormal current.

The use of the shunt resistor RS, the microcomputer 903 and the like indispensably requires a large mounting space. Further, those components are relatively expensive, so that cost to manufacture the power supply control device is high.

SUMMARY OF INVENTION

Accordingly, an object of the present invention is to provide a power supply control device in which there is no need of using the shunt resistor connected in series to the power supply path for detecting current, to thereby reduce the heat loss, and it quickly responds to an abnormal current when an imperfect short-circuit, such as a layer short-circuit, having a certain amount of short-circuit resistance occurs, and it may be fabricated into an integrated circuit and has a reduced cost to manufacture, and a method of controlling such a power supply control device.

According to the present invention, there is provided a first power supply control device comprising:

a semiconductor switch which responds to a control signal applied to a control signal input terminal to be switched and controls the supply of electric power from a power supply to a load;

reference voltage generating means for generating a reference voltage having a voltage characteristic substantially equivalent to that of a voltage between the terminals of the semiconductor switch;

detecting means for detecting a difference between the voltage between the terminals of the semiconductor switch and the reference voltage;

control means for performing an on/off control of the semiconductor switch in accordance with the difference between the voltage between the terminals of the semiconductor switch and the reference voltage.

A second power supply control device of the invention corresponds to the first power supply control device specified such that the reference voltage generating means includes a circuit connected in parallel with the semiconductor switch and the load, the circuit containing a series circuit consisting of a second semiconductor switch and a second load, and generates a voltage between the terminals of the second semiconductor switch as the reference voltage.

A third power supply control device of the invention corresponds to the first or second power supply control device specified such that a voltage characteristic of the reference voltage of the reference voltage generating means is substantially equivalent to a voltage characteristic in a state that a target current, which is in excess of a maximum current within a normal operation range, flows into the semiconductor switch and the load.

A fourth power supply control device of the invention corresponds to the second or third power supply control device specified such that a transient voltage characteristic of a voltage between the terminals of the semiconductor switch when the semiconductor switch shifts its state from an off state to an on state is equivalent to the corresponding one when the second semiconductor switch shift its state so.

A fifth power supply control device of the invention corresponds to any of the second to fourth power supply control device specified such that a current capacity of the second semiconductor switch is smaller than that of the semiconductor switch, and a resistance ratio of the load and the second load is substantially inversely proportional to a current capacity ratio of the semiconductor switch and the second semiconductor switch.

A sixth power supply control device of the invention corresponds to any of the first to fifth power supply control device which further comprises second reference voltage generating means including a circuit, connected in parallel with the semiconductor switch and the load, containing a series circuit consisting of a third semiconductor switch switched in accordance with the control signal and a third load, and the second reference voltage generating means generating a second reference voltage having a voltage characteristic substantially equivalent to a voltage characteristic of the voltage between the terminals of the semiconductor switch, the second reference voltage being a voltage between the terminals of the third semiconductor switch; and second detecting means for detecting a difference between the voltage between the terminals of the semiconductor switch and the second reference voltage.

A seventh power supply control device of the invention corresponds to the sixth power supply control device specified such that a voltage characteristic of the reference voltage of the second reference voltage generating means is substantially equivalent to a voltage characteristic in a state that a target current, which is below a minimum current within a normal operation range, flows into the semiconductor switch and the load.

An eighth power supply control device of the invention corresponds to the sixth or seventh power supply control device specified such that a transient voltage characteristic of a voltage between the terminals of the semiconductor switch when the semiconductor switch shifts its state from an off state to an on state is equivalent to the corresponding one when the third semiconductor switch shift its state so.

A ninth power supply control device of the invention corresponds to any of the sixth to eighth power supply control device specified such that a current capacity of the third semiconductor switch is smaller than that of the semiconductor switch, and a resistance ratio of the load and the third load is substantially inversely proportional to a current capacity ratio of the semiconductor switch and the third semiconductor switch.

A tenth power supply control device of the invention corresponds to any of the second to ninth power supply control device specified such that the second or third load includes a plurality of resistors and a resistance value of the second or third load is adjustable by selectively connecting the plurality of resistors.

An 11th power supply control device of the invention corresponds to any of the second to tenth power supply control device specified such that the second or third load includes variable resistors connected in parallel, and a resistance value of the second or third load is adjustable by use of the variable resistors.

A 12th power supply control device of the invention corresponds to any of the second to eleventh power supply control device which further comprises voltage dividing means for dividing a voltage between the terminals of the semiconductor switch at a voltage division ratio based on a resistance value ratio, and applying the resultant voltage to the detecting means, and the voltage division ratio of the voltage dividing means is adjusted through a resistance value variation.

A 13th power supply control device of the invention corresponds to any of the first to 12th power supply control device specified such that the control means performs an off control of the semiconductor switch when a difference between the detected terminal-to-terminal voltage and the reference voltage exceeds a first threshold value, and an on control of the semiconductor switch when a difference between the detected terminal-to-terminal voltage and the reference voltage is below the second threshold value.

A 14th power supply control device of the invention corresponds to any of the first to 13th power supply control device which further comprises overheat protecting means for protecting the semiconductor switch by performing an off-control of the semiconductor switch when the semiconductor switch is excessively heated.

A 15th power supply control device of the invention corresponds to any of the first to 14th power supply control device specified such that the semiconductor switch, the reference voltage generating means, the detecting means, the control means, the second reference voltage generating means, the second detecting means or the overheat protecting means are fabricated on a single chip.

A 16th power supply control device of the invention corresponds to the 15th power supply control device specified such that the second load within the reference voltage generating means and the third load within the second reference voltage generating means are mounted outside the chip.

A 17th power supply control device of the invention corresponds to any of the first to 16th power supply control device specified such that the period of the on/off control of the semiconductor switch by the control means is used as a control clock signal.

An 18th power supply control device of the invention corresponds to any of the first to 17th power supply control device which further comprises inhibiting means for inhibiting the control means from performing the on/off control by the semiconductor switch during a fixed time period after the semiconductor switch is turned on.

A 19th power supply control device of the invention corresponds to any of the 14th to 18th power supply control device which further comprises overheat cut-off quickening means for quickening the off control by the overheat protecting means when the control means performs the on/off control of the semiconductor switch.

A 20th power supply control device of the invention corresponds to any of the first to 19th power supply control device which further comprises time control means operating such that the time control means accumulates the number of on/off controls of the semiconductor switch by the control means, and when the number of on/off controls reaches a predetermined number of times, the time control means performs an off control of the semiconductor switch.

According to another aspect of the present invention, there is provided a first method of controlling a power supply control device having a semiconductor switch which responds to a control signal applied to a control signal input terminal to be switched and controls the supply of electric power from a power supply to a load, the method comprising the steps of:

generating a reference voltage having a voltage characteristic substantially equivalent to that of a voltage between the terminals of the semiconductor switch;

detecting a difference between the voltage between the terminals of the semiconductor switch and the reference voltage;

performing an on/off control of the semiconductor switch in accordance with the difference between the voltage between the terminals of the semiconductor switch and the reference voltage.

The invention provides a second method of controlling the power supply control device, which corresponds to the first method, specified such that in the reference voltage generating step, a voltage characteristic of the reference voltage is substantially equivalent to a voltage characteristic in a state that a target current, which is in excess of a maximum current within a normal operation range, flows into the semiconductor switch and the load.

The invention provides a third method of controlling the power supply control device, which corresponds to the first or second method, specified such that the control step includes an off control step for performing an off control of the semiconductor switch when a difference between the detected terminal-to-terminal voltage and the reference voltage exceeds a first threshold value, and an on control step for performing an on control of the semiconductor switch when a difference between the detected terminal-to-terminal voltage and the reference voltage is below the second threshold value The invention provides a fourth method of controlling the power supply control device, which corresponds to any of the first to third methods, the fourth method further comprising an overheat protecting step for protecting the semiconductor switch by performing an off-control of the semiconductor switch when the semiconductor switch is excessively heated.

The invention provides a fifth method of controlling the power supply control device, which corresponds to any of the first to fourth methods, the fifth method further comprising inhibiting step for inhibiting the control means from performing the on/off control by the semiconductor switch during a fixed time period after the semiconductor switch is turned on.

The invention provides a sixth method of controlling the power supply control device, which corresponds to the fourth or fifth method, specified such that the off control by the overheat protecting step is quickened when the on/off control of the semiconductor switch is performed in the control step.

The invention provides a seventh method of controlling the power supply control device, which corresponds to any of the first to sixth methods, the seventh method further comprising a time control step for accumulating the number of on/off controls of the semiconductor switch by the control means, and when the number of on/off controls reaches a predetermined number of times, the time control step performs an off control of the semiconductor switch.

In the first to 14th power supply control devices and in the first to fourth methods of controlling a power supply control device, when the power supply from the power source to the load is controlled in a switching manner by the semiconductor switch, reference voltage generating means (reference voltage generating step) generates a reference voltage having a voltage characteristic substantially equivalent to that of a voltage between the terminals of the semiconductor switch. Detecting means (detecting step) detects a difference between the voltage between the terminals of the semiconductor switch and the reference voltage. Control means (control step) performs an on/off control of the semiconductor switch in accordance with the difference between the voltage between the terminals of the semiconductor switch and the reference voltage.

The semiconductor switch (and the second and third semiconductor switches to be described later) may be any of the following switching elements: FET (field effect transistor), SIT (static induction transistor), MOS composite type semiconductor device, e.g., MCT (MOS control thyristor), insulated gate power device, e.g., IGBT (insulated gate bipolar transistor), and others. Those switching elements may be of the n-channel type or the p-channel type.

In the second power supply control device of the invention, it is preferable that the reference voltage generating means includes a circuit connected in parallel with the semiconductor switch and the load, the circuit containing a series circuit consisting of a second semiconductor switch and a second load, and generates a voltage between the terminals of the second semiconductor switch as the reference voltage. In the sixth power supply control device, it is preferable that second reference voltage generating means includes a circuit, connected in parallel with the semiconductor switch and the load, containing a series circuit consisting of a third semiconductor switch and a third load, and generates a voltage between the terminals of the third semiconductor switch as a second reference voltage, and second detecting means detects a difference between the voltage between the terminals of the semiconductor switch and the second reference voltage.

In the third power supply control device of the invention and the first power supply control method, it is preferable that a voltage characteristic of the reference voltage of the reference voltage generating means is substantially equivalent to a voltage characteristic in a state that a target current, which is in excess of a maximum current within a normal operation range, flows into the semiconductor switch and the load. In the seventh power supply control device of the invention, it is preferable that a voltage characteristic of the reference voltage of the second reference voltage generating means is substantially equivalent to a voltage characteristic in a state that a target current, which is below a minimum current within a normal operation range, flows into the semiconductor switch and the load. In the fourth or eighth power supply control device of the invention, it is preferable that a transient voltage characteristic of a voltage between the terminals of the semiconductor switch when the semiconductor switch shifts its state from an off state to an on state is equivalent to the corresponding one when the second or third semiconductor switch shift its state so.

Let the semiconductor switch be an FET. In this case, the voltage between the terminals (across drain-source path) of the FET as a part of the power supply path varies (in the voltage characteristic (descending curve of the n-channel FET, for example) when the FET shifts its state from an off state to an on state) depending on a state of the power supply path and the load, viz., in accordance with a time constant of the wiring inductance and the wiring and short-circuit resistance of the power supply path. In a normal operation of the power supply control device in which no short-circuit occurs, the voltage swiftly converges to a voltage below a predetermined voltage. When a dead short-circuit occurs, the voltage does not drop to below the predetermined one. When an imperfect short-circuit having some resistance occurs, some time is taken until the voltage has converged to the predetermined one.

The present invention utilizes a transient voltage characteristic of the semiconductor switch when it shifts its state from an off state to an on state. An offset of a voltage between the terminals of the semiconductor switch (viz., current of the power supply path) as a part of the power supply path, from a normal one is judged by detecting a difference between a voltage between the terminals of the semiconductor switch and a reference voltage generated by the reference voltage generating means (reference voltage generating step) or the second reference voltage generated by the second reference voltage generating means. If a voltage characteristic of the reference voltage is substantially equivalent to a voltage characteristic in a state that a target current, which is in excess of a maximum current within a normal operation range, flows into the load, an overcurrent can be detected by the detecting means (detecting step). If a voltage characteristic of the second reference voltage is set to be substantially equivalent to a voltage characteristic in a state that a target current, which is below a minimum current within a normal operation range, flows into the load, the detecting means (detecting step) can detect a too-small or minute current.

Accordingly, for the current detection, there is no need of the shunt resistor connected in series to the power supply path, while the shunt resistor is indispensably used in the conventional power supply control device. Further, the heat loss of the device may be suppressed. Additionally, the power supply control device enables the hardware circuit or a software process by the microcomputer to successively detect not only the overcurrent arising from the dead short-circuit but also the abnormal current arising from the layer short-circuit, such as an imperfect short-circuit having a certain amount of resistance. Further, the power supply control device can detect an overcurrent without the shunt resistor. In particular when the on/off control of the semiconductor switch is constructed by a hardware circuit, there is no need of the microcomputer, and this leads to reduction of the mounting space and device manufacturing cost.

Particularly in the fifth power supply control device of the invention, a current capacity of the second semiconductor switch is smaller than that of the semiconductor switch, and a resistance ratio of the load and the second load is substantially inversely proportional to a current capacity ratio of the semiconductor switch and the second semiconductor switch. The current capacity ratio of the semiconductor switch and the second semiconductor switch may be realized by a ratio of the numbers of transistors of the switches connected in parallel when the semiconductor switch and the second semiconductor switch are FETs. A resistance of the second load is defined by (load resistance)×(current capacity of the semiconductor switch/current capacity of the second semiconductor switch). When the second load is, for example, a fixed resistor, and a load resistance when the filament of a lamp load, for example, is cool is different from the corresponding one when it is heated, it is impossible to exactly match the resistance ratio of the load and the second load to the current capacity ratio. In such a case, it is desirable to match those ratios, for example, by setting the resistance of the second load to the load resistance when the lamp load is continuously lit on. When the circuit is so specified, the reference voltage generating means including the semiconductor switch and the second load is minimized in size, leading to reduction of the element fabricating space and cost to fabricate the device.

In particular in the ninth power supply control device, a current capacity of the third semiconductor switch is smaller than that of the semiconductor switch, and a resistance ratio of the load and the third load is substantially inversely proportional to a current capacity ratio of the semiconductor switch and the third semiconductor switch. When the circuit is specified as in the fifth power supply control device, the second reference voltage generating means including the third semiconductor switch and the third load is minimized in size, leading to reduction of the element fabricating space and cost to fabricate the device.

In the tenth power supply control device, the second or third load includes a plurality of resistors, and a resistance value of the second or third load is adjustable by selectively connecting the plurality of resistors. A set value of the reference voltage generating means or the second reference voltage generating means in judging an offset of a voltage between the terminals of the semiconductor switch (viz., current of the power supply path) from a normal one, viz., a reference for the judgement of an overcurrent caused by a short-circuit or the like may be set by varying the resistance of the second load, and a reference for judging a minute current may be set by varying the resistance of the third load. When the second or third load, for example, is formed on a chip, a plurality of resistors are disposed in parallel within the chip. In the stage of chip packaging or the pair chip mounting, the set value (reference) of the reference voltage generating means or the second reference voltage generating means may be set to a target specification by selecting a proper one of those resistors. With this, in integrating the power supply control device onto a semiconductor chip, one chip may cover a plurality of specifications. With the variable setting of the variable resistor, it is possible to perfectly discriminate between the dead short-circuit and the imperfect short-circuit for the type of the load (e.g., head lamps, drive motor, or the like). Protection against the short-circuit trouble is effected with high precision.

Particularly, in an 11th power supply control device of the invention, the second or third load includes variable resistors connected in parallel, and a resistance value of the second or third load is adjustable by use of the variable resistors. When the second or third load, for example, is formed on a chip, a plurality of resistors are disposed in parallel within the chip. The set value (reference) of the reference voltage generating means or the second reference voltage generating means may be set to a target specification by varying resistor resistance. With this, in integrating the power supply control device onto a semiconductor chip, one chip may cover a plurality of specifications. With the variable setting of the variable resistor, it is possible to perfectly discriminate between the dead short-circuit and the imperfect short-circuit for the type of the load (e.g., head lamps, drive motor, or the like). Protection against the short-circuit trouble is effected with high precision. When the second load resistor is formed on the chip, a temperature drift of resistance occurs in the resistor, and the resistance value shifts from the resistance value of the load resistor which is determined depending on the current capacity ratio. To cope with this, the second load resistor may be mounted outside the chip so as to be insensitive to temperature variation. In this case, one chip may cover a plurality of specifications by selecting the resistance value according to the specification.

In the 12th power supply control device, voltage dividing means for dividing a voltage between the terminals of the semiconductor switch at a voltage division ratio based on a resistance value ratio, and applying the resultant voltage to the detecting means, and the voltage division ratio of the voltage dividing means is adjusted through a resistance value variation. When the second load, for example, is formed on the chip, the variable resistor for voltage division ratio adjustment is mounted outside the chip. The set value (reference) of the reference voltage generating means may be set to a target specification by adjusting the resistance of the variable resistor. With this, in integrating the power supply control device onto a semiconductor chip, one chip may cover a plurality of specifications. With the variable setting of the variable resistor, it is possible to perfectly discriminate between the dead short-circuit and the imperfect short-circuit for the type of the load (e.g., head lamps, drive motor, or the like). Protection against the short-circuit trouble is effected with high precision.

In the 13th power supply control device and the second power supply control method, the control means performs an off control of the semiconductor switch when a difference between the terminal-to-terminal voltage detected (in the off control step) and the reference voltage exceeds a first threshold value, and an on control of the semiconductor switch when a difference between the terminal-to-terminal voltage detected (in on control step) and the reference voltage is below the second threshold value. With this feature, the on/off control of stable periods is realized by use of a simple control circuit.

In the 14th power supply control device and the third power supply control method, overheat protecting means (overheat protecting step) is further provided for protecting the semiconductor switch by performing an off-control of the semiconductor switch when the semiconductor switch is excessively heated. When an imperfect short-circuit having some short-circuit resistance occurs, the control means (control step, viz., the off control step and on control step) repeats the on/off control of the semiconductor switch to greatly vary the current. At this time, the semiconductor switch is periodically heated to quicken the cutting off of the semiconductor switch by the overheat protecting means (overheat protecting step). In the conventional power supply control device, only the software process using the microcomputer, for example, is permitted for dealing with the abnormal current caused when the layer short-circuit occurs. On the other hand, the power supply control device of the invention can deal with the abnormal current by the hardware circuit contained therein, not the external control using the microcomputer. This feature leads to simplification of the circuit and reduction of manufacturing cost.

In the 15th power supply control device of the invention, it is preferable that the semiconductor switch, the second semiconductor switch, the reference voltage generating means, the detecting means, the control means, the second reference voltage generating means, the second detecting means or the overheat protecting means are fabricated on a single chip. In the 16th power supply control device, it is preferable that the second load within the reference voltage generating means and the third load within the second reference voltage generating means are mounted outside the chip. Thus, the circuit is integrated onto a same chip. This results in reduction of the device circuit, mounting space, and manufacturing space. A current detecting method of the invention is based on the detection of a difference between a voltage between the terminals of semiconductor switch and a reference voltage or the second reference voltage, which is carried out by the detecting means or the second detecting means. Therefore, with fabrication of the semiconductor switch and the second or third semiconductor switch on a same chip, it is possible to eliminate (reduce) the error by common mode deviation in the current detection, viz., unwanted effects by drifts of the power source voltage and temperature, and variations among different manufacturing lots. Additionally, the mounting of the second or third load outside the chip makes the reference voltage or the second reference voltage insensitive to temperature variations of the chip, realizing highly accurate current detection.

The power supply side terminal and the control signal input terminal of the semiconductor switch are respectively connected to the power supply side terminal and the control signal input terminal of the second semiconductor switch of the reference voltage generating means or the third semiconductor switch of the second reference voltage generating means. The loadside terminal of the second or third semiconductor switch is connected to the second or third load present independently of the load. With such connections, judgement may be made as to whether a current flowing through the power supply path is normal or abnormal by comparing a potential at the load side terminal of the semiconductor switch with a potential at the load side terminal of the second or third semiconductor switch. Thus, the terminals of the semiconductor switches are used in common for both the semiconductor switch and the second or third semiconductor switch. This makes it easy to fabricate those switches into a same semiconductor chip.

In the 17th power supply control device of the invention, the period of the on/off control of the semiconductor switch by the control means is used as a control clock signal. With this feature, there is no need of using an oscillating circuit used exclusively for the clock signal generation. In a case where the semiconductor switch is an FET, a variation of the drain-source voltage of the FET with respect to a variation of the load current in the pinch off region is higher than that in the ohmic region. Because of this, it is turned off in the pinch off region during the on/off control (there is no case that it is turned off in the ohmic region following the pinch off region). Accordingly, the period of the on/off control of the FET is stable, and a stable clock signal is produced.

In the present specification, terms of "pitch off region" and "ohmic region" are used as the FET element characteristic. The correct definition of these terms is described in Page 66 of "Analysis and Design of ANALOG INTEGRATED CIRCUITS" (Third Edition), PAUL R. GRAY, ROBERT G. MEYER.

In the 18th second power supply control device and the fourth power supply control method, inhibiting means is further provided for inhibiting the control means from performing the on/off control by the semiconductor switch during a fixed time period after the semiconductor switch is turned on. At the start of the load, usually a rush current flows through the power supply control device. A value of the rush current amounts to several to several tens times as large as a current value the current flowing in a stable state of the circuit. If the overcurrent control is performed during the rush-current flowing period, some time is taken until the load 102 settles down. This appears as unwanted phenomena; the turning on of the head lamp delays and a response of the load per se is slow. This invention can solve the problem by using inhibiting means (inhibiting step).

In the 19th power supply control device and the fifth power supply control method, overheat cut-off quickening means (control step) is further provided for quickening the off control by the overheat protecting means (overheat protecting step) when the control means performs the on/off control of the semiconductor switch. When an overcurrent by a dead short is detected, the overheat protecting means quickly functions to cut off (off control) the semiconductor switch. When a layer short circuit occurs, the on/off control of the semiconductor switch is repeated, and the resultant periodic heating of the semiconductor switch causes the protecting means to operate. Therefore, some time will elapse until the semiconductor switch is turned off. The present invention can quicken the cutting off of the semiconductor switch even in the case of the layer short circuit by use of the overheat cut-off quickening means.

In the 20th power supply control device and the sixth power supply control method, time control means (time control step) is further provided which operates such that the time control means accumulates the number of on/off controls of the semiconductor switch by the control means (in control step), and when the number of on/off controls reaches a predetermined number of times, the time control means performs an off control of the semiconductor switch. When an overcurrent by a dead short is detected, the overheat protecting means quickly functions to cut off (off control) the semiconductor switch. When a layer short circuit occurs, the on/off control of the semiconductor switch is repeated, and the resultant periodic heating of the semiconductor switch causes the protecting means to operate. Therefore, some time will elapse consumed until the semiconductor switch is turned off. In the invention, when the number of on/off controls of the semiconductor switch reaches a predetermined number of times, the semiconductor switch is turned off. Therefore, even in the case of the layer short circuit, the cutting off of the semiconductor switch is quickened and the switch is cut off at a preset time.

DETAILED DESCRIPTION OF PREFERRED EMBODIMENTS

The preferred embodiments of a power supply control device and a method of controlling the same will be described with reference to FIGS. 1 through 18. In the description, the embodiments will be given in the order of first to sixth embodiments, and a modification of the sixth embodiment, and seventh to eighth embodiments. The power supply control device and the method of controlling the same which are constructed according to the present invention will be described by use of a power supply control device for controlling the supply of electric power from a battery to a load including lamps in a vehicle, such as a motor vehicle. However, it should be understood that the present invention may be applied to any power supply control device if it is capable of controlling the power supply from a power source to a load in a switching manner, and a method of controlling the same.

Figure 1:
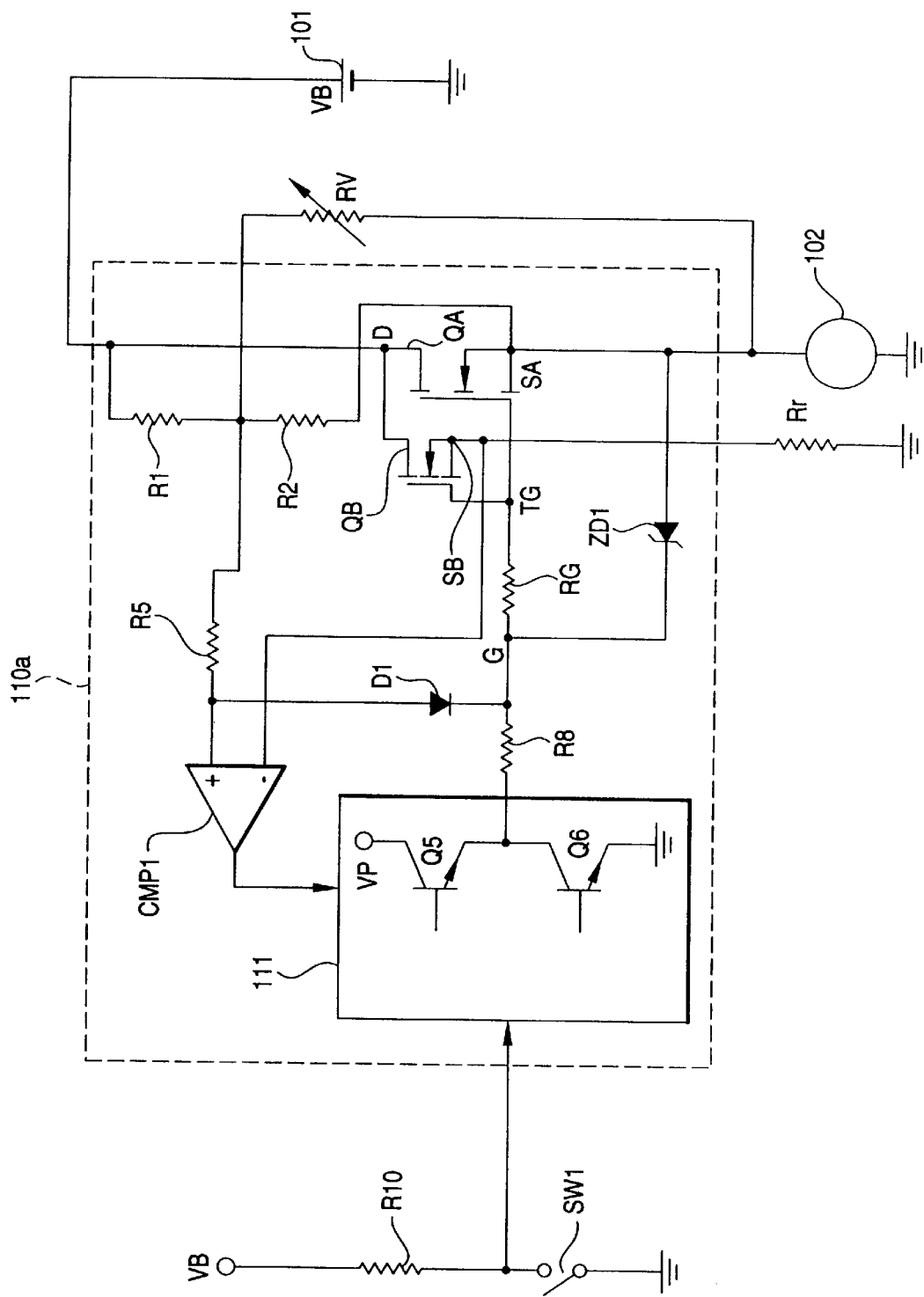
FIG. 1 is a circuit diagram showing a power supply control device which is a first embodiment of the present invention.
Figure 2:
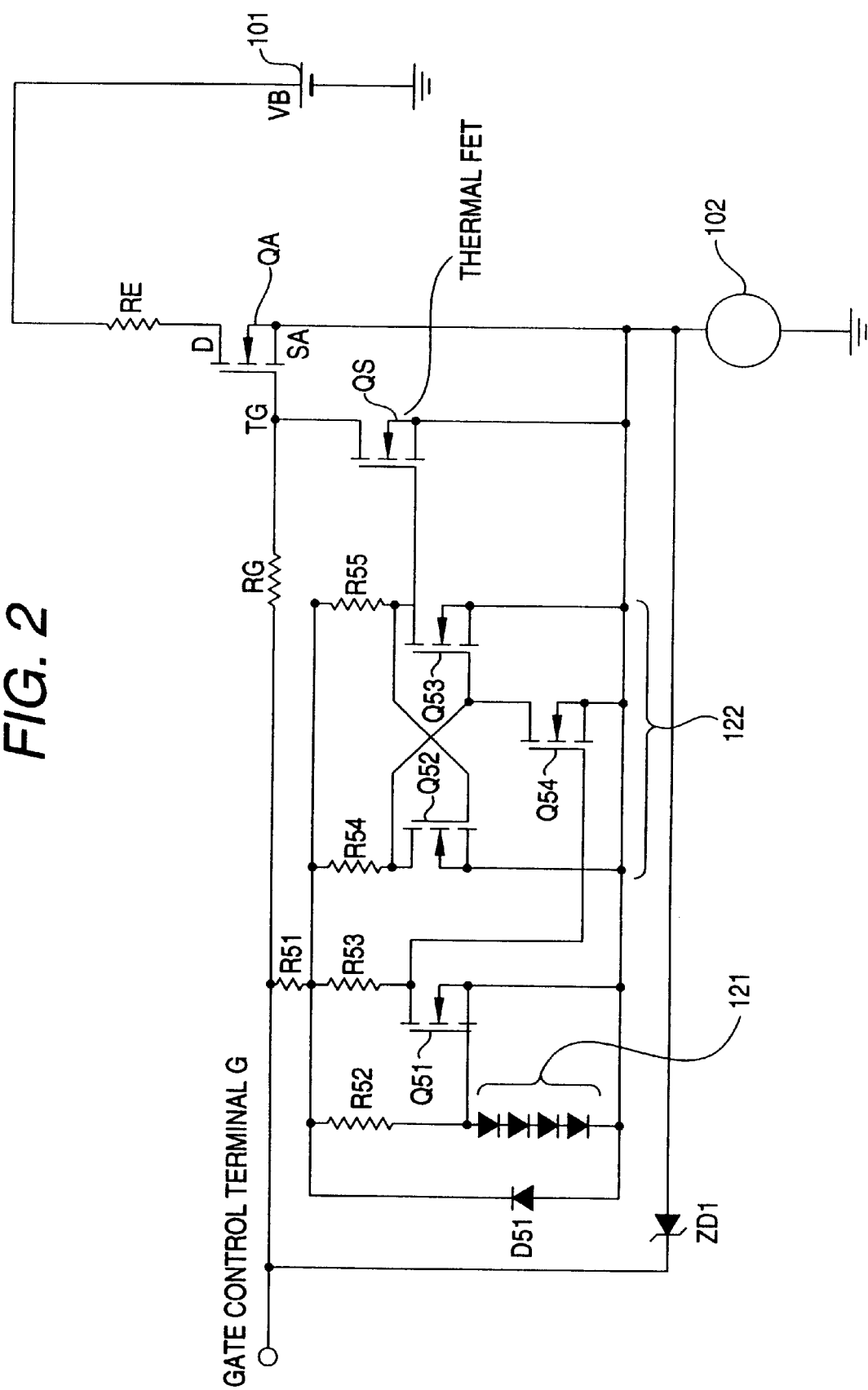
FIG. 2 is a circuit diagram showing in detail a semiconductor switch (thermal FET) used in the embodiment.
Figure 3:
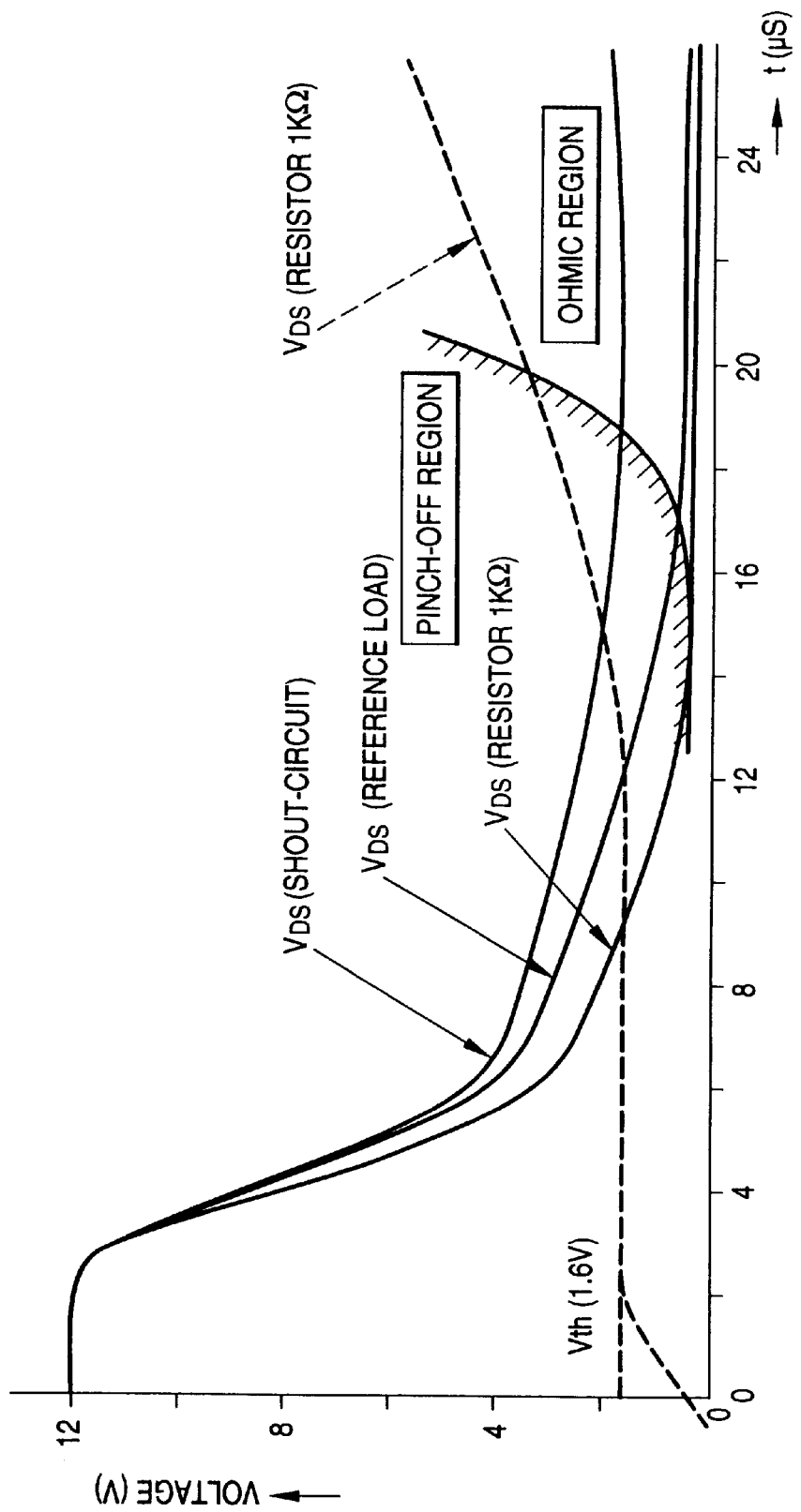
FIG. 3 is an explanatory diagram useful in explaining the principles of the power supply control device and the method of controlling the same, which form a first embodiment of the present invention, the diagram showing an desending characteristic curve of the drain-source voltage when an FET shifts its state from an off state to an on state.
Figure 4:
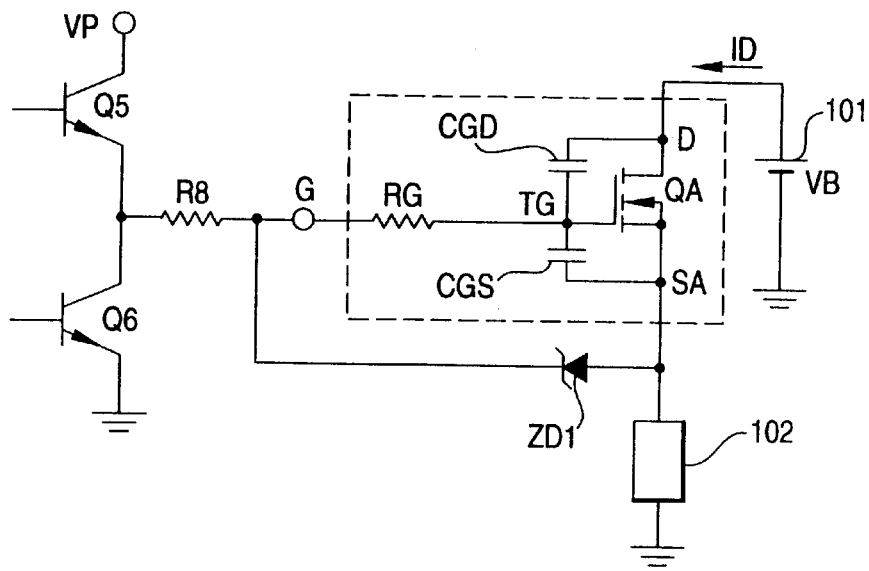
FIG. 4 is an explanatory diagram useful in explaining the principles of the power supply control device and the method of controlling the same, the diagram showing a conception circuit diagram.
Figure 5:
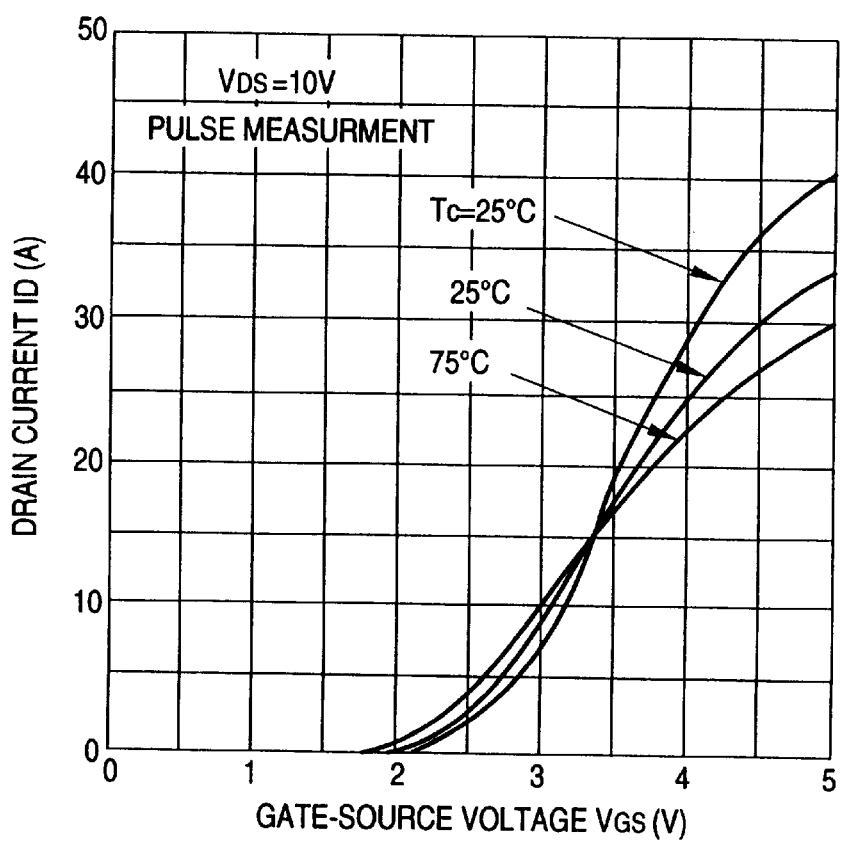
FIG. 5 is an explanatory diagram useful in explaining the principles of the power supply control device and the method of controlling the same, the diagram showing a variation of an drain current of a thermal FET with respect to the gate-source voltage.
Figure 6:
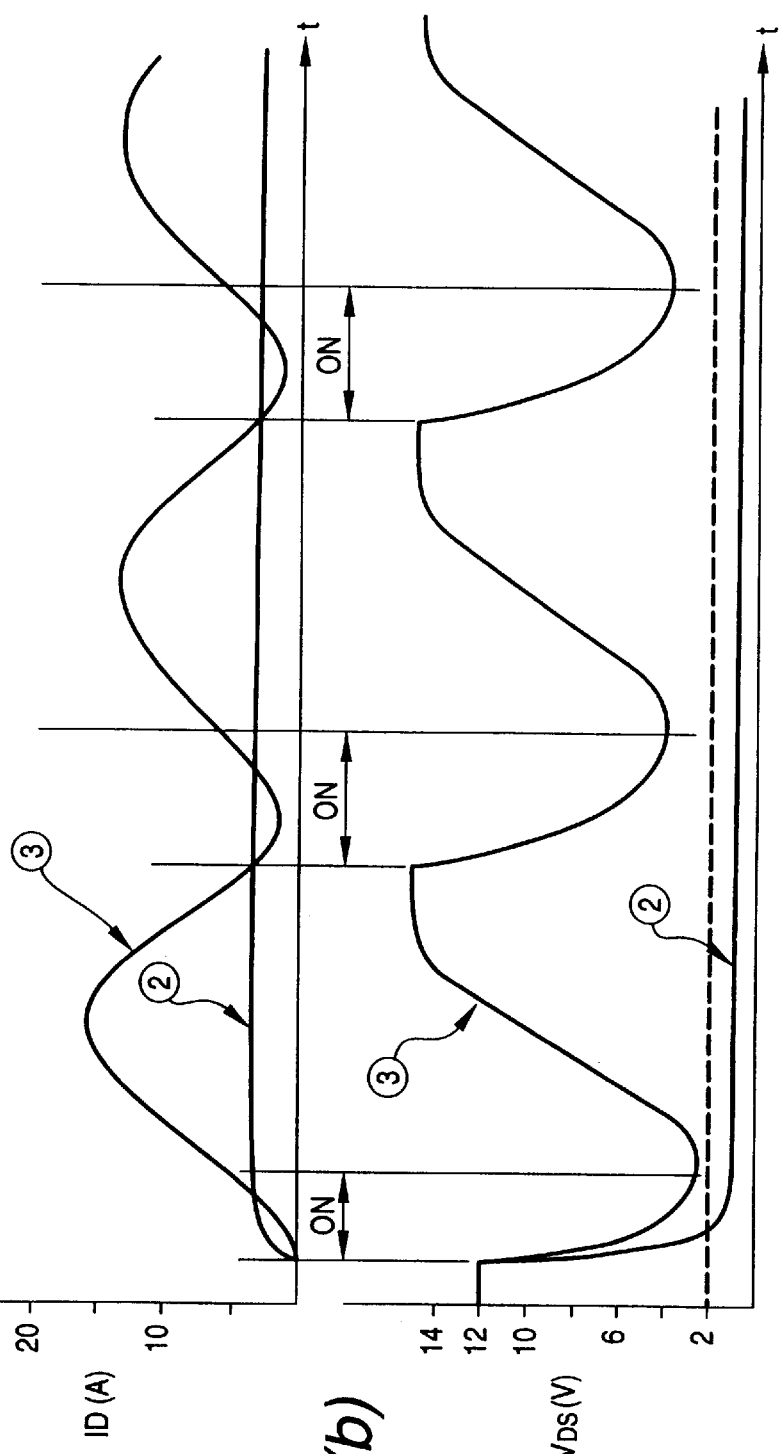
FIG. 6 is a waveform diagram showing a current FIG. 6(a) and a voltage FIG. 6(b) in a semiconductor switch used in the power supply control device when the power supply control device suffers from short-circuit and it normally operates.
Figure 7:
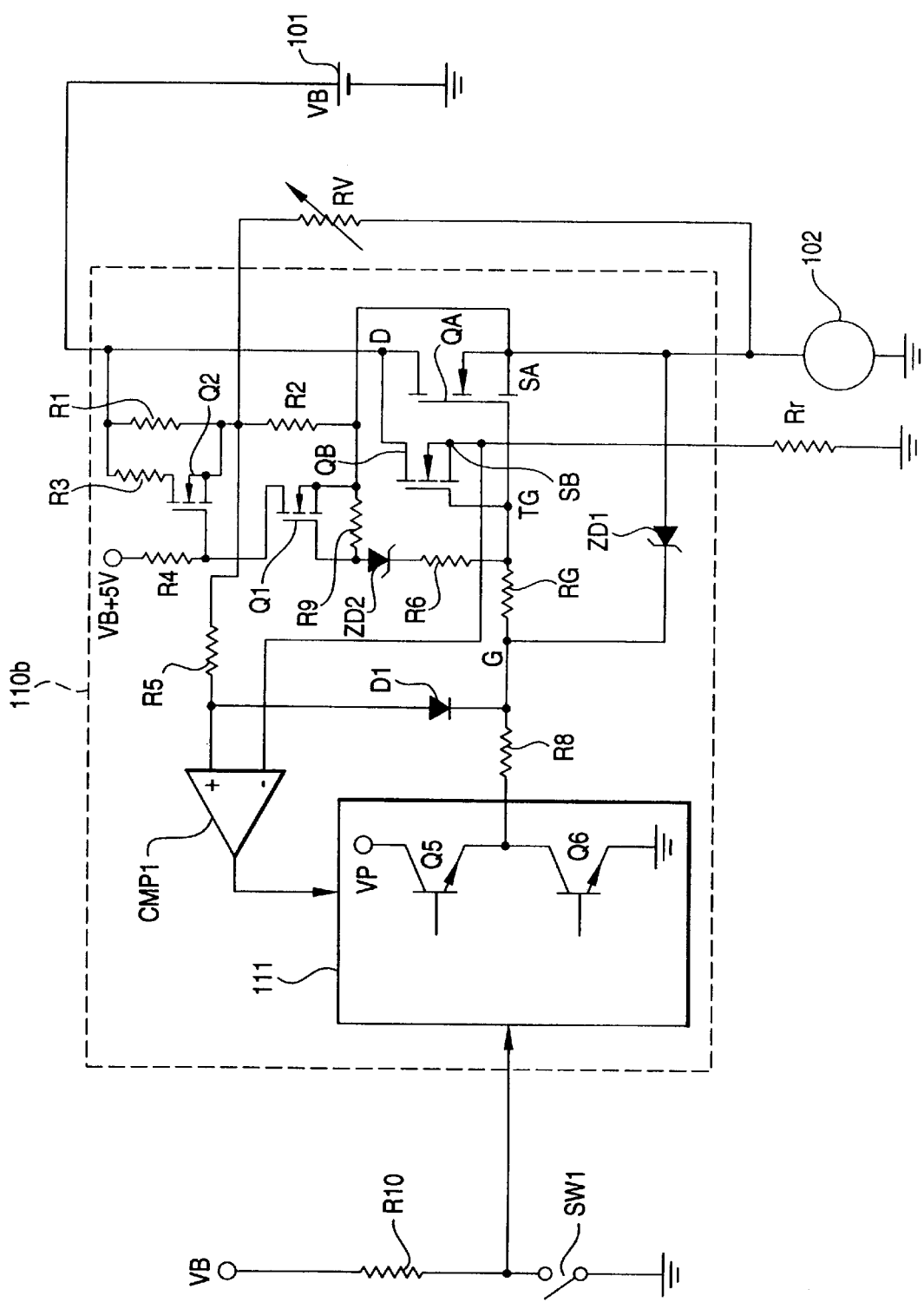
FIG. 7 is a circuit diagram showing a power supply control device which is a second embodiment of the present invention.
Figure 8:
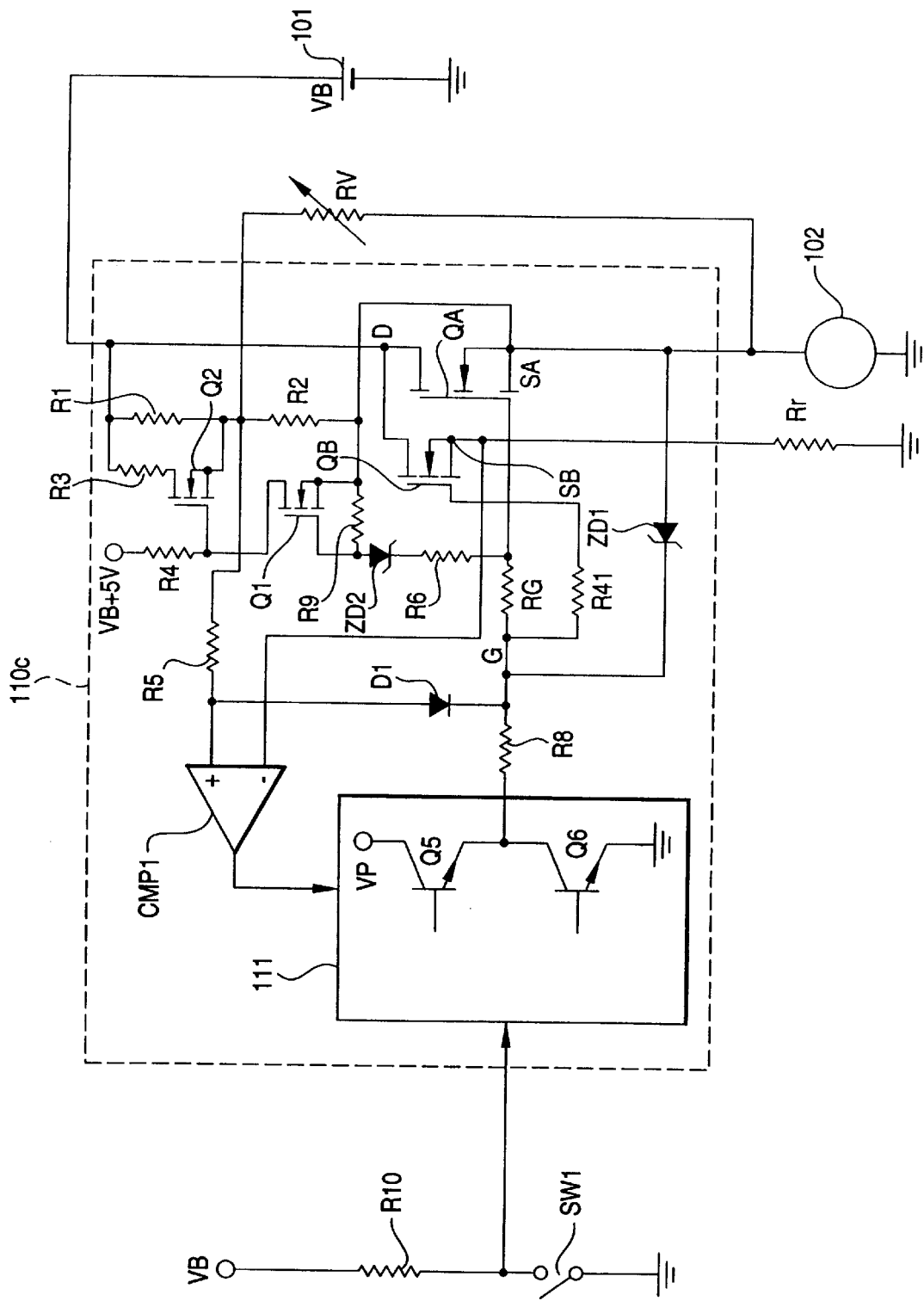
FIG. 8 is a circuit diagram showing a power supply control device which is a third embodiment of the present invention.
Figure 9:
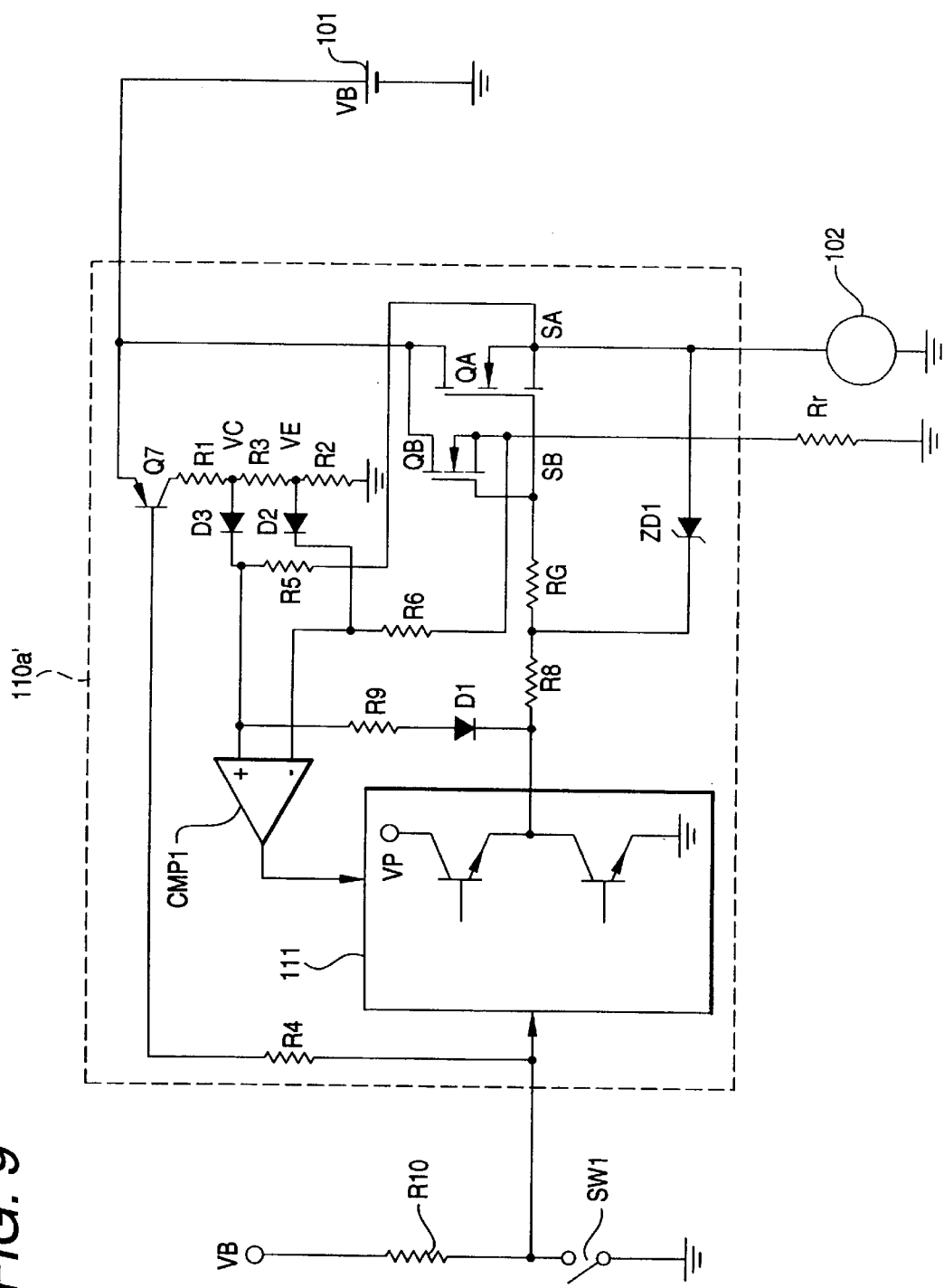
FIG. 9 is a circuit diagram showing a power supply control device which is a fourth embodiment of the present invention.
Figure 10:
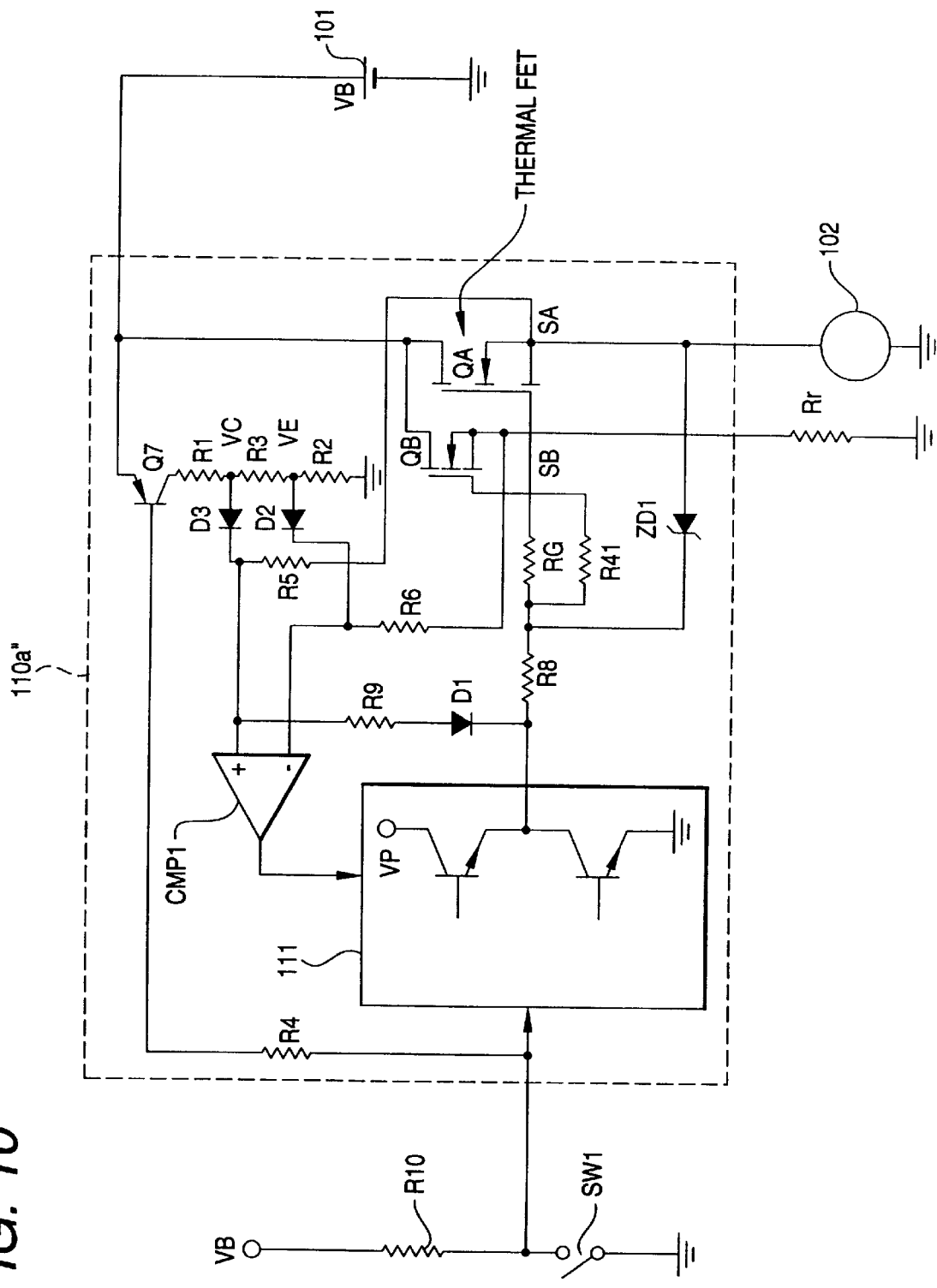
FIG. 10 is a circuit diagram showing a power supply control device which is a fourth embodiment of the present invention.
Figure 11:
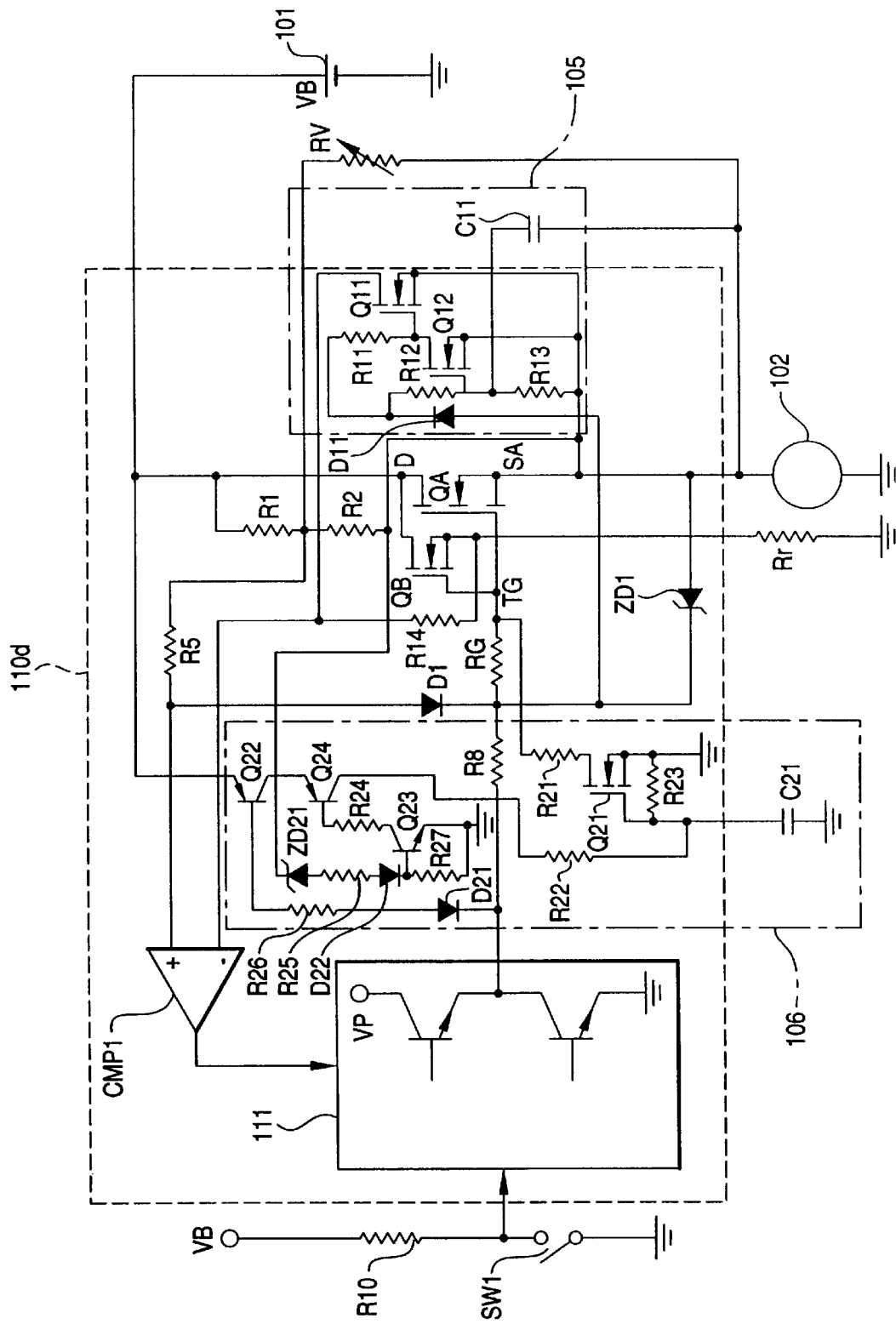
FIG. 11 is a circuit diagram showing a power supply control device which is a fifth embodiment of the present invention.
Figure 12:
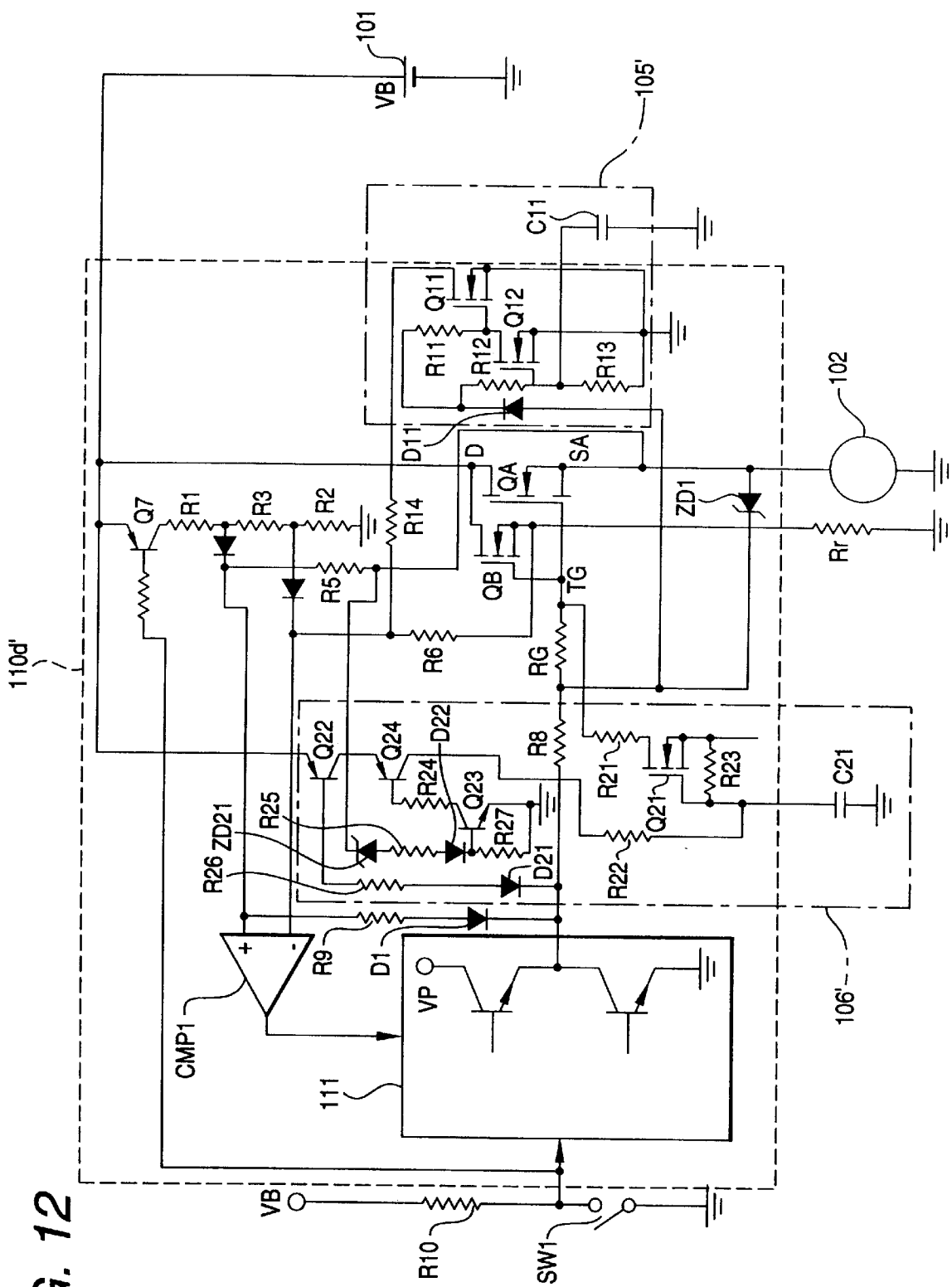
FIG. 12 is a circuit diagram showing a power supply control device which is a fifth embodiment of the present invention.
Figure 13:
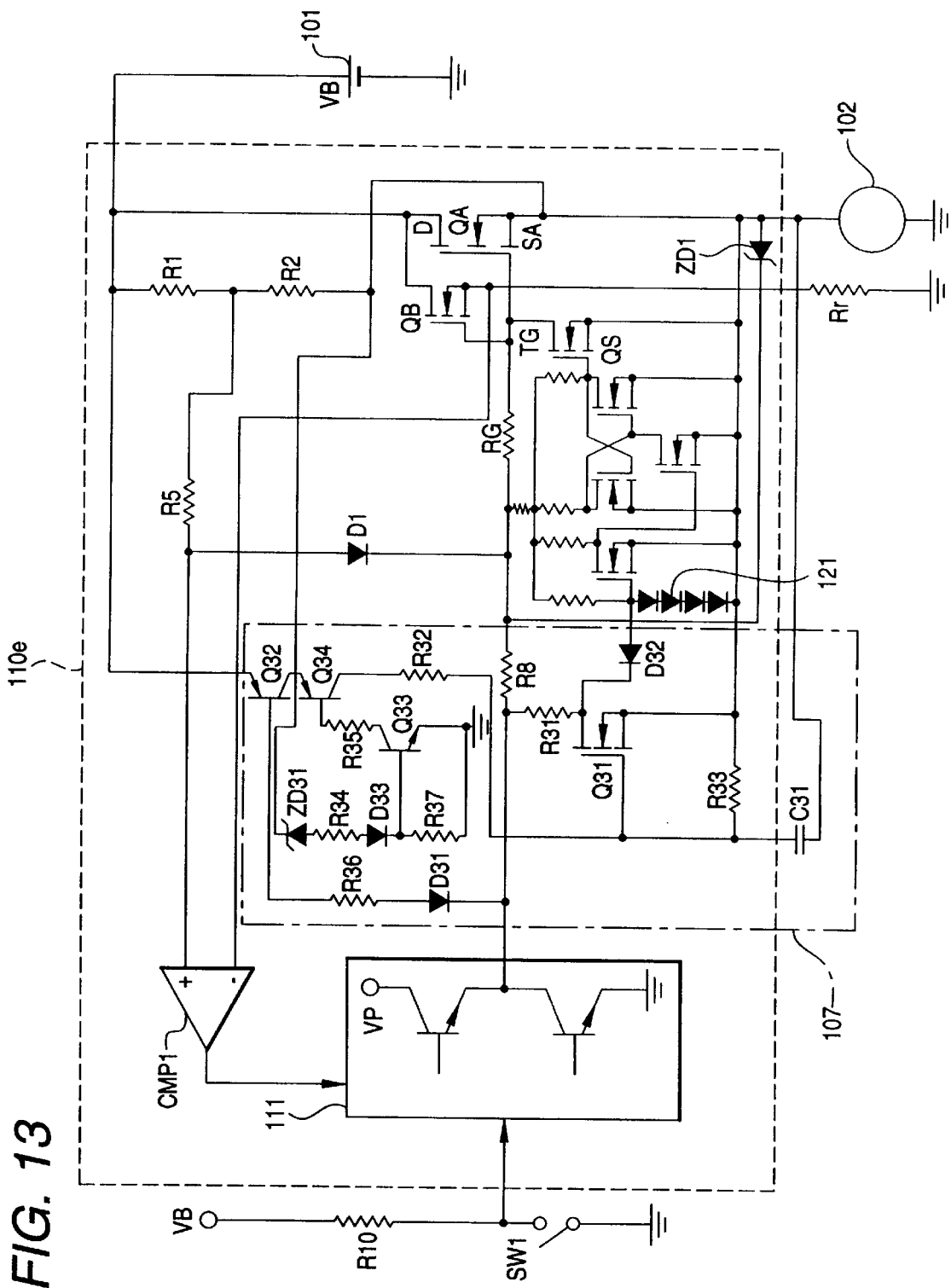
FIG. 13 is a circuit diagram showing a power supply control device which is a sixth embodiment of the present invention.
Figure 14:
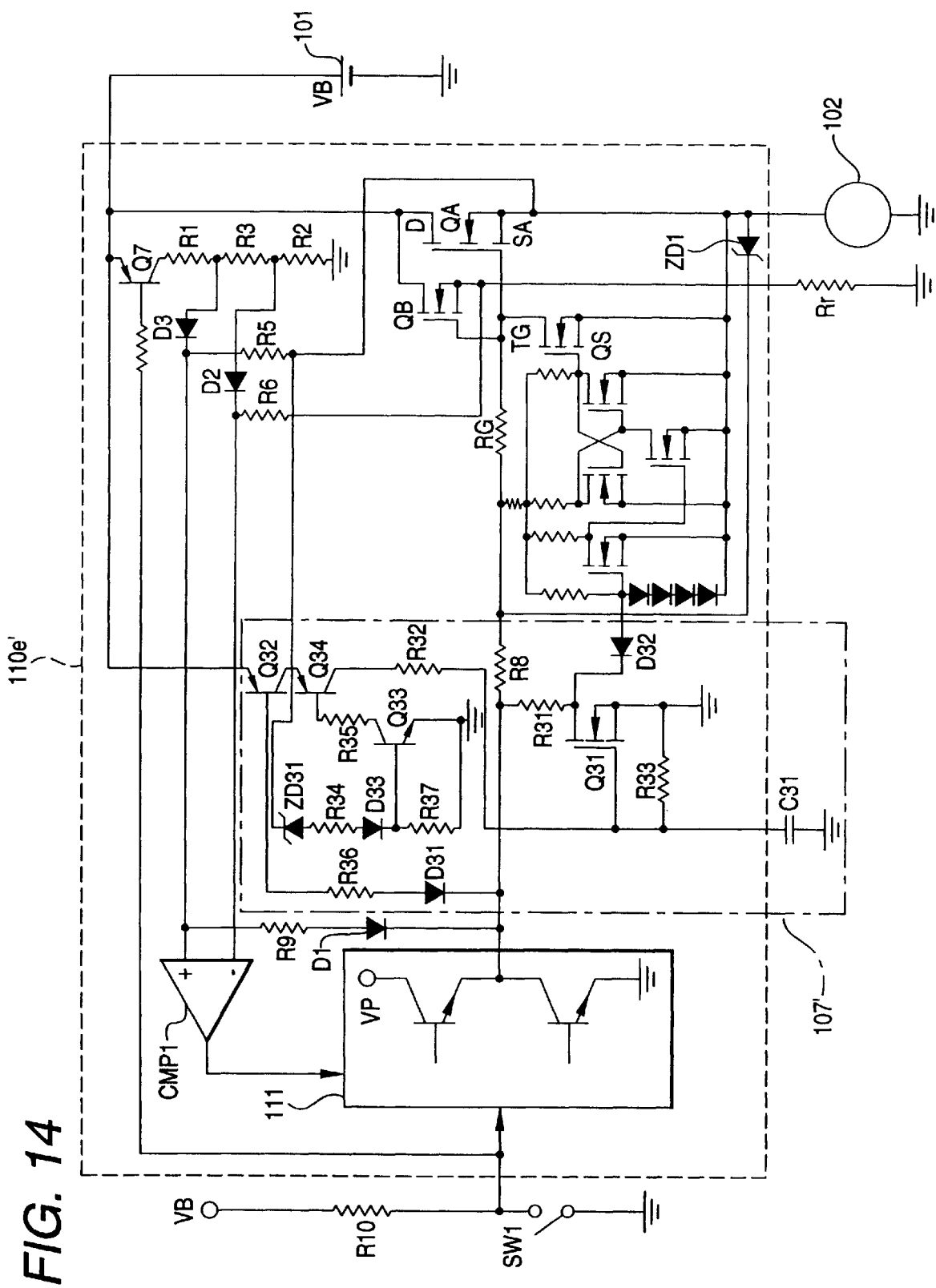
FIG. 14 is a circuit diagram showing a power supply control device which is a sixth embodiment of the present invention.
Figure 15:
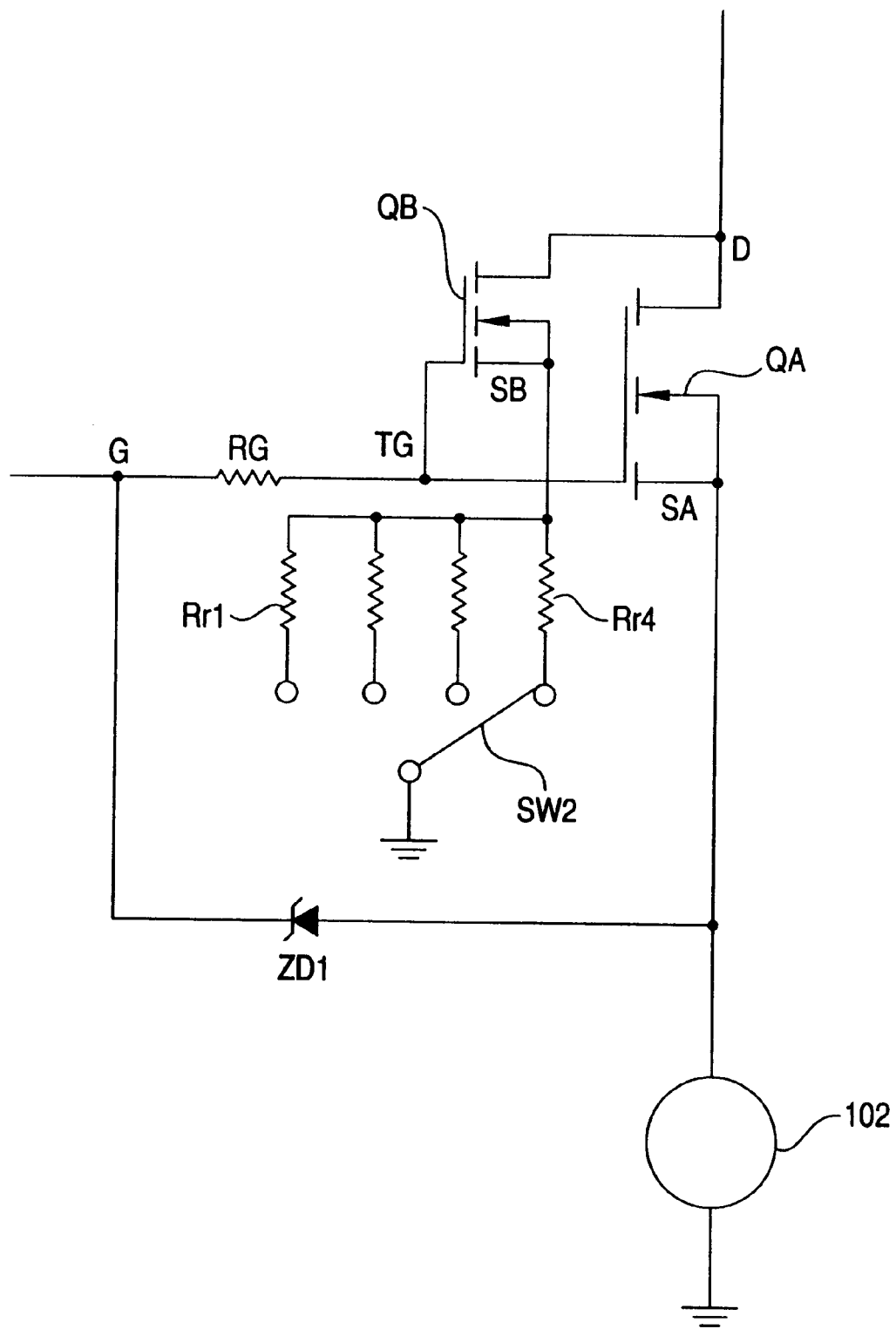
FIG. 15 is a circuit diagram showing a second load (resistors) in a modification of the power supply control device.
Figure 16:
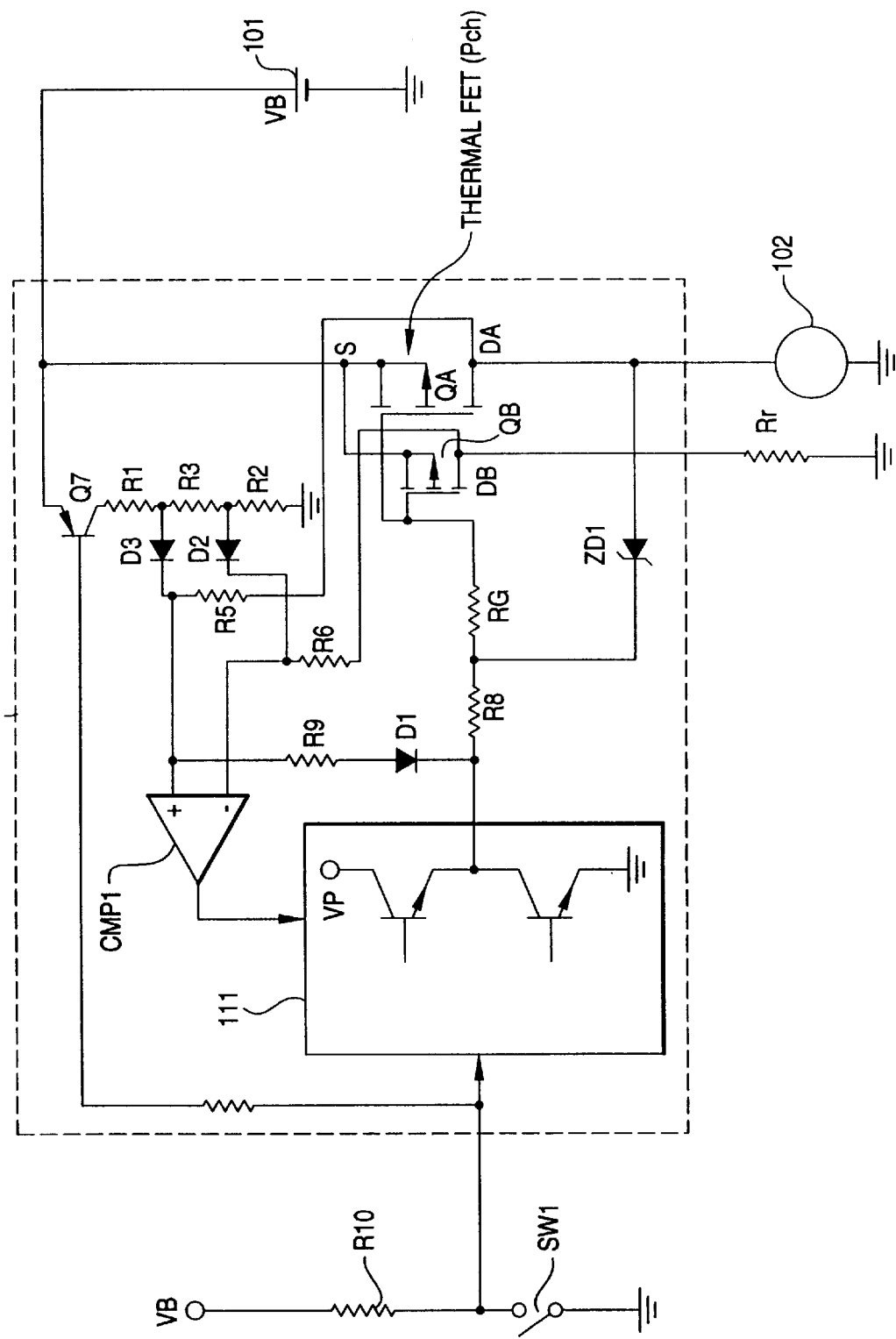
FIG. 16 is a circuit diagram showing a power supply control device which is a seventh embodiment of the present invention.
Figure 17:
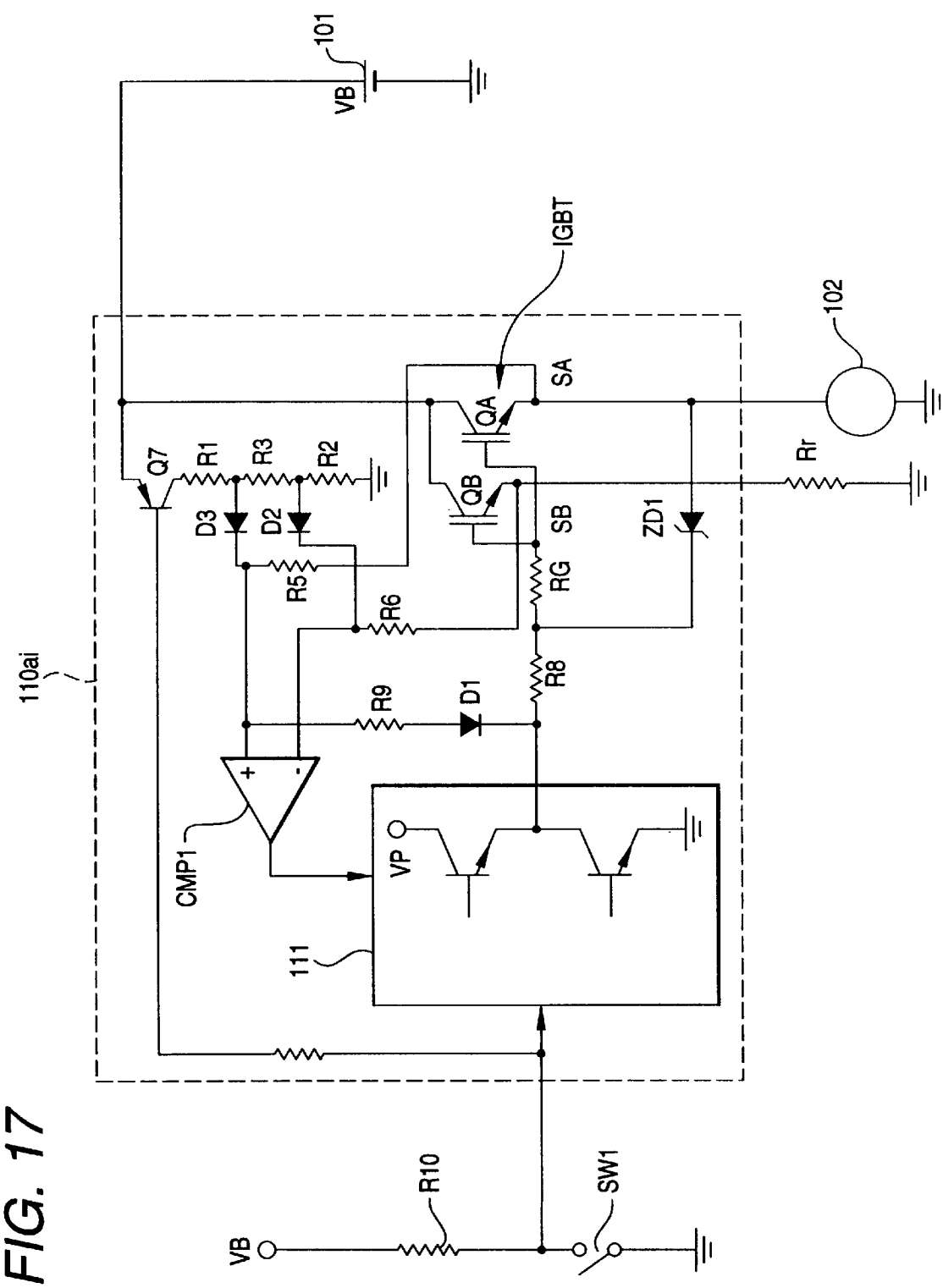
FIG. 17 is a circuit diagram showing a power supply control device which is a seventh embodiment of the present invention.

FIG. 1 is a circuit diagram showing a power supply control device which is a first embodiment of the present invention. FIG. 2 is a circuit diagram showing in detail a semiconductor switch (MAIN CONTROL FET) used in the embodiment. FIGS. 3, 4 and 5 are explanatory diagrams useful in explaining the principles of the power supply control device and the method of controlling the same which form a first embodiment of the present invention. FIG. 6 is a waveform diagram showing a current and a voltage in a semiconductor switch used in the power supply control device when the power supply control device suffers from short-circuit and it normally operates. FIG. 7 is a circuit diagram showing a power supply control device which is a second embodiment of the present invention. FIG. 8 is a circuit diagram showing a power supply control device which is a third embodiment of the present invention. FIGS. 9 and 10 are circuit diagrams showing a power supply control device which is a fourth embodiment of the present invention. FIGS. 11 and 12 are circuit diagrams showing a power supply control device which is a fifth embodiment of the present invention. FIGS. 13 and 14 are circuit diagrams showing a power supply control device which is a sixth embodiment of the present invention. FIG. 15 is a circuit diagram showing a second load (resistors) in a modification of the power supply control device. FIGS. 16 and 17 are circuit diagrams showing a power supply control device which is a seventh embodiment of the present invention.

Figure 18:
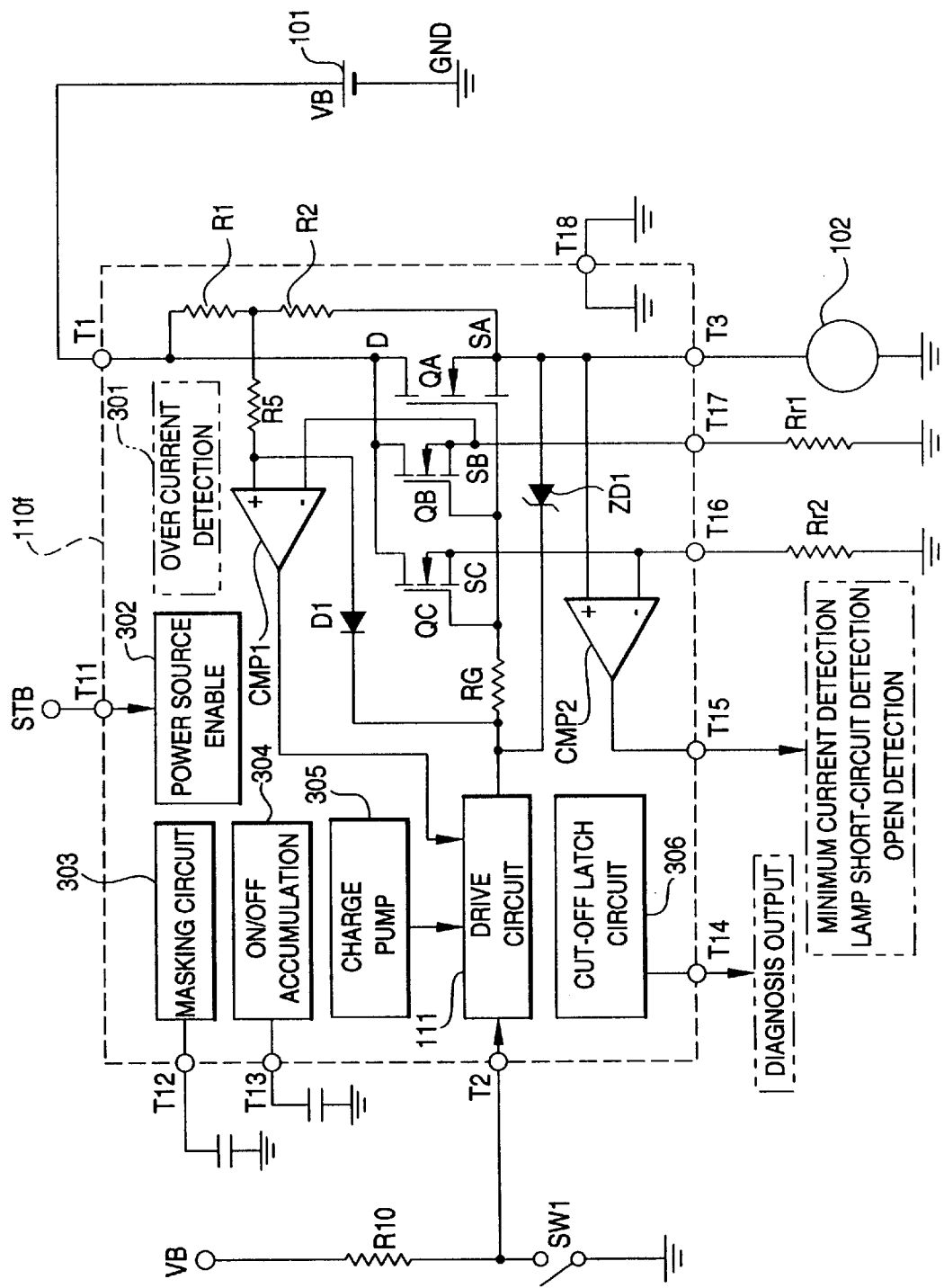
FIG. 18 is a circuit diagram showing a power supply control device which is an eighth embodiment of the present invention.
Figure 19:
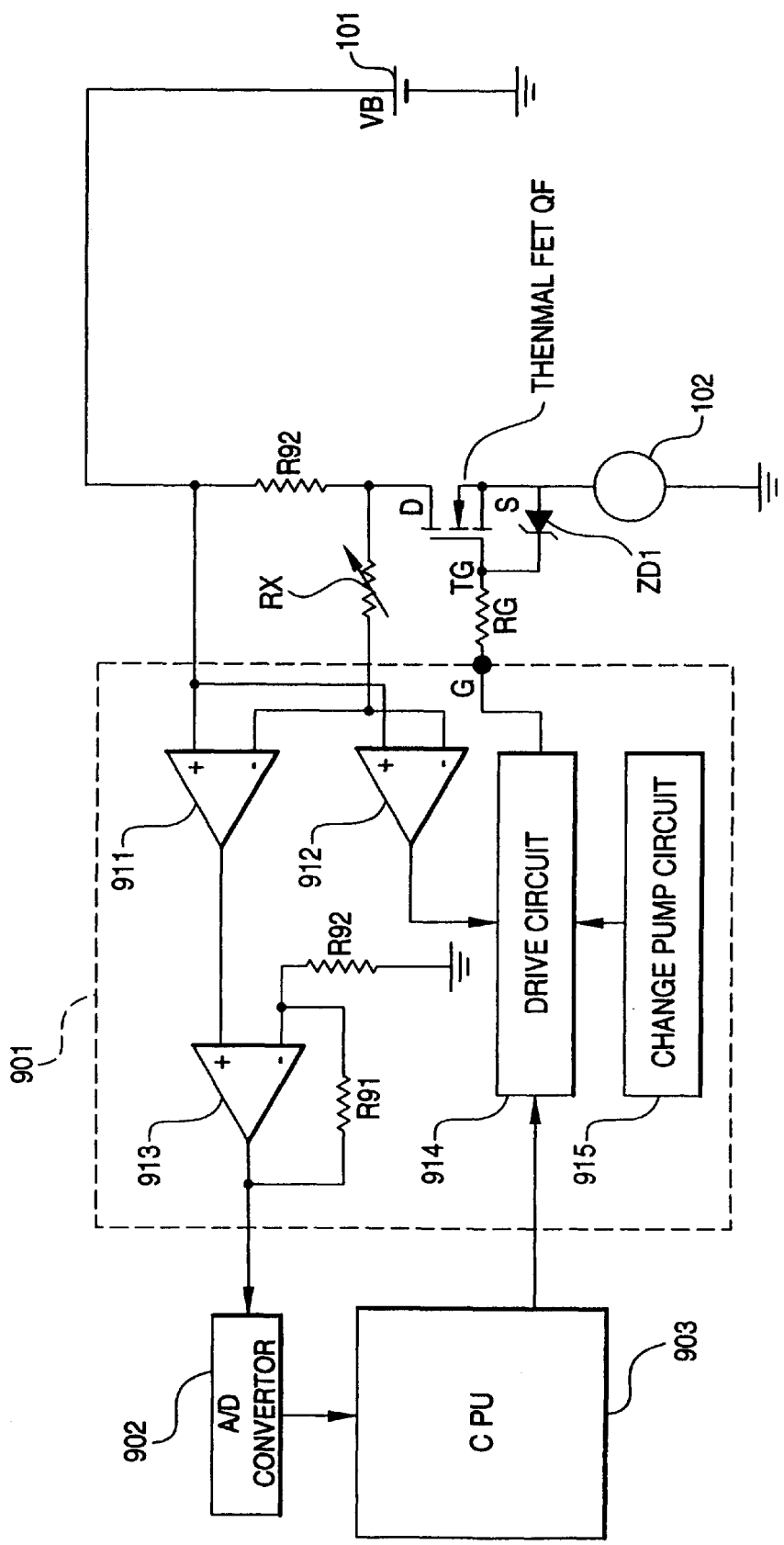
FIG. 19 is a circuit diagram of a conventional power supply control device with a semiconductor switch.

FIG. 18 is a circuit diagram showing a power supply control device which is an eighth embodiment of the present invention.

First Embodiment

The power supply control device which is the first embodiment of the present invention will be described with reference to FIG. 1. In the power supply control device, a drain D-source SA path of a main control FET QA as a semiconductor switch is inserted in series in a path for applying an output voltage VB of a power source 101 to a load 102. While the main control FETQA is of the NMOS type in the circuit, it may be of the PMOS type.

In the figure, a circuit section for driving the main control FETQA contains a REFERENCE FETQB, resistors R1, R2, R5, R8, R10, RG, Rr and RV, a Zener diode ZD1, a diode D1, a comparator CMP1, a drive circuit 111, and a switch SW1. In the specification, capital letters "Rs" with numerals and characters attached thereto are used for designating the resistors and also their resistance values. In FIG. 1, a portion enclosed by a dotted line indicates an analog IC chip onto which the circuit components within the enclosed portion are integrated.

The load 102 includes head lamps, drive motors for power windows and others. It is operated when a user turns on the switch SW1. The drive circuit 111 includes a series circuit of a source transistor Q5 connected at the collector to a potential VP, and a sink transistor Q6 connected at the emitter to ground potential (GND). In response to an on/off signal of the switch SW1, the source transistor Q5 and the sink transistor Q6 are turned on and off, so that the drive circuit 111 outputs a signal for driving the FET QA. In the figure, VB indicates an output voltage of 12V, for example. VP indicates an output voltage of a charge pump. VP is of VB +10V, for example.

The detail of the main control FETQA as a semiconductor switch is as shown in FIG. 2. As shown in FIG. 2, the main control FETQA includes an internal resistor RG, a temperature sensor 121, a latch circuit 122, and an overheat cut-off FET QS. The Zener diode ZD1 keeps the voltage between the gate G and the source SA of the FET at 12V, and when an overvoltage is applied to the gate G of FET, it forms a bypass for the overvoltage flow or progration.

The main control FETQA of the present embodiment has such an overheat cut-off function that when the temperature sensor 121 detects that a temperature of the main control FETQA rises to a predetermined temperature or higher, information of the high temperature is held in the latch circuit 122 and the overheat cut-off FET QS as a gate cut-off circuit is turned on to forcibly turn off the main control FETQA.

The temperature sensor 121 consists of four diodes connected in series, and when fabricated, it is located near the main control FETQA. With increase of a temperature of the main control FETQA, resistance values of those diodes of the temperature sensor 121 decrease. Accordingly, when a potential at the gate of a FET Q51 lowers to a potential corresponding to "L" level, a state of the FET Q51 shifts from an on state to an off state. As a result, a gate potential of an FET Q54 is pulled up to a potential at the gate control terminal G of the main control FETQA, a state of the FET Q54 shifts from an off state to an on state, and finally "1" is latched in the latch circuit 122. At this time, an output signal level of the latch circuit 122 is an "H" level, and the overheat cut-off FET QS shifts its state from an off state to an on state. Accordingly, the true gate TG of the main control FETQA and the source SA of the same are at an equal potential. The main control FETQA shifts its state from an on state to an off state. As a result, the overheat cut-off operation is effected.

The power supply control device has also protection function against an overcurrent caused by a short-circuit which occurs at load 102 or between the source SA of the main control FETQA and the load 102, or against an abnormal current caused by an imperfect short-circuit. A circuit arrangement to realize the protection functions will be described with reference to FIG. 1.

The reference voltage generator is made up of the FET (second semiconductor switch) QB and the resistor (second load) Rr. The drain and gate of the REFERENCE FETQB are connected to the drain D and the true gate TG of the main control FETQA, respectively. The source SB of the REFERENCE FETQB is connected to one of the terminals of the resistor Rr, which is connected at the other terminal to ground potential GND. Thus, the drain D and the true gate TG are used in common for both the main control FETQA and the REFERENCE FETQB. This makes it easy to fabricate those FETs into a same semiconductor chip.

The main control FETQA and the REFERENCE FETQB are fabricated on a same chip by a same process. A current detecting method which is employed in the embodiment, is based on a detection of a difference between a voltage V DSA across the drain-source path of the main control FETQA and a reference voltage, the detection being carried out by the comparator CMP1. Therefore, with fabrication of the REFERENCE FETQB and the main control FETQA into the same chip, it is possible to eliminate (reduce) the error caused by common mode deviation in the current detection, viz., unwanted effects by drifts of the power source voltage and temperature, and variations among different manufacturing lots. Additionally, the mounting of the resistor (second load) Rr outside the chip 110a makes the reference voltage insensitive to temperature variations of the chip 110a, realizing highly accurate current detection. Thus, the drain D and the true gate TG are used in common for both the main control FETQA and the SECOND REFERENCE FETQB. This makes it easy to fabricate those FETs into a same semiconductor chip.

In order that a current capacity of the REFERENCE FETQB is smaller than that of the main control FETQA, ratios of the numbers of parallel-connected transistors which form those FETs are selected to be:

(number of transistors of the reference FETQB: 1 transistor) <(number of transistors of the main control FETQA: 1000 transistors).

A resistance value of the resistor Rr, as will be described later, is set to be (resistance value of the load 102)×(number of transistors of the main control FETQA: 1000 transistors/ number of transistors of the REFERENCE FETQB: 1 transistor). By setting the resistor Rr so, when a load current of 5A, which flows when the power supply control device normally operates, flows through the main control FETQA and a current 5 mA flows through the resistor Rr, the drain-source voltages VDS of the FET QB is equal to the corresponding one of the main control FETQA. When the circuit is so specified, the reference voltage generating means including the REFERENCE FETQB and the resistor Rr is minimized in size, leading to reduction of the element fabricating space and cost to fabricate the device.

A resistance of the resistor R2 is equivalently varied by varying the resistance of the variable resistor RV.

Varying the variable resistor RV in its resistance may equivalently vary a resistance value of the resistor R2. Voltage division means, which includes the resistors R1, R2 and RV, divides the drain-source voltage VDSA of the main control FETQA at a voltage division ratio based on a resistance value ratio of those resistors, and applies the resultant voltage to the comparator CMP1. The voltage division ratio is varied with the variable resistor RV. With use of the variable resistor RV, a threshold value of the drain-source voltage VDS may be varied which is used for switching the output signal level of the comparator CMP1 from an "H" level to a "L" level with respect to a fixed set value (reference value) of the reference voltage generating means. This enables a same type of semiconductor chip 110a to cover a plurality of specifications when the circuit is fabricated into an analog integrated circuit.

The comparator CMP1 is the detector, which is used in setting forth claims. A "+" input terminal of the comparator CMP1 receives through the resistor R5 a voltage, which is produced by dividing the drain-source voltage VDSA of the main control FETQA by a parallel resistance (R2∥RV) of the resistor R2 and the variable resistor RV, which are connected in parallel. A "−" input terminal of the comparator CMP1 receives the drain-source voltage VDSB of the REFERENCE REFERENCE FETQB. When a potential at the + input terminal of the comparator CMP1 is higher than that at the − input terminal, the output of the comparator CMP1 is valid ("H" level). Conversely, when the potential at the + input terminal of the comparator CMP1 is lower than that that at the − input terminal, the output of the comparator CMP1 is invalid ("L" level). As will be described later, the comparator CMP1 has a hysteresis characteristic.

A method of controlling the thus arranged power supply control device of the first embodiment of the present invention will be described. The principles on which the power supply control device and the method of controlling the same, which are the embodiments of the invention, are based will be described with reference to FIGS. 3, 4 and 5. FIG. 3 is a graph showing a descending characteristic curve of a voltage across the drain-source path of the FET QA when the FET QA shifts its state from an off state to an on state. FIG. 4 is a circuit diagram showing the concept of a power supply path ranging from the power source 101 to the load 102. FIG. 5 is a graph useful in explaining a characteristic curve of a drain current of the thermal FET with respect to the gate-source voltage.

A power supply path ranging from the power source 101 to the load 102 may electrically be expressed as shown in FIG. 4 when the main control FETQA is used for the semiconductor switch. The load 102 includes a wire inductance L0 and a wire resistance R0 of the power supply path. When a short-circuit occurs in the power supply path or the load 102, the wire resistance includes a short-circuit resistance. The short-circuit resistance is approximately 40 m Ω when the dead short-circuit occurs and approximately 40 to 500 mΩ when the layer short-circuit occurs if the load 102 is head lamps in the motor vehicle to which the present invention is applied.

A curve representative of a voltage across the drain-source path of the main control FETQA descends as shown in FIG. 3 when the main control FETQA as a part of the power supply path shifts its state from an off state to an on state. The characteristic curve plotted are those of cases where a short-circuit occurs, the load is a reference load (normally operates), and the load resistance is 1 KΩ.

Thus, the descending characteristic curves varies depending on states of the power supply path and the load, viz., a time constant defined by wire inductance and resistance of the power supply path, and the short-circuit resistance.

Examples of known methods for detecting an overcurrent by utilizing the characteristic variation of the drain-source voltage VDS are an overcurrent detecting method described hereunder and a method for detecting an overcurrent by comparing the present current value with a predetermined reference value at predetermined timings. To construct means for determining the predetermined timings and means for comparing it with the predetermined threshold value, circuit components such as capacitors and resistors are required. Fluctuation of the value of those circuit components lead to detection errors. Further, the capacitors, which are indispensably used, cannot be fabricated into the semiconductor chip. Therefore, those must be located outside the chip, leading to increase of the cost to manufacture.

The main control FETQA operates in a pinch-off region until the main control FETQA shifts its state to an on state and the drain-source voltage VDS is saturated.

A variation of the drain-source voltage VDS when the load 102 is 1 KΩ may be considered in the following way. Firstly, when the main control FETQA is, for example, "HAF2001", manufactured by Hitachi corporation in Japan at power supply voltage in 12V, the gate-source voltage VTGS is kept at approximately 1.6 V of the threshold voltage since the drain current ID=12 mA. Secondly, the charging of the gate G by the drive circuit 111 continues. If it continues, the gate-source voltage VTGS will rise. However, the drain-source voltage VDS drops and a gate-drain capacity CGD discharges. As a result, the charge that will reach the gate-source voltage VTGS is absorbed. In other words, the drain-source voltage VDS drops to discharge the gate-drain capacity CGD at such a rate as to cause the gate-drain capacity CGD to discharge such an amount of charge as to prevent the charge supplied by the gate drive circuit from further increasing the voltage of VTGS. As a result, the gate-source voltage VTGS is kept at approximately 1.6 V. With the decrease of the gate-drain voltage VTGD, the drain-source voltage VDS also drops. Two factors to absorb the charge at this time are present; a first factor is the discharging of the gate-drain capacity CGD due to the drop of the gate-drain voltage VTGD, and a second factor is an increase of the capacitance of the gate-drain capacity CGD due to a decrease of the depletion layer of the n-region.

The following interpretation may also hold about a variation of the drain-source voltage VDS when the load 102 is 1 KΩ.

From the characteristic curves, one knows such values of the drain-source voltage VDS that charging electrical charges to be sent to the true gate TG by the drive circuit 111 are absorbed and the gate-source voltage VTGS of the true gate TG is kept constant, at the respective time points following the turning-on of the main control FETQA.

Accordingly, if after a time lapses, the drain-source voltage VDS is located above the characteristic curve when the load resistance=1 KΩ, the gate-source voltage VTGS is higher than 1.6 V.

When the amount of charge of ΔVDSGAP×CGD is subtracted from the gate-source voltage VTGS at anytime often turning-on off FETQA, the gate-source voltage VTGS results in 1.6 V. Here, ΔVDSGAP represents a distance of the present characteristic curve measured vertically from the characteristic curve when the load resistance=1 KΩ (FIG. 3). In other words, the gate-source voltage VTGS has been increased from 1.6V by this amount of charge. A mathematical expression of this is $$VTGS-1.6=\Delta VDSGAP\times 2CGD/(CGS+2CGD)$$

Thus, ΔVDSGAP is proportional to (gate-source voltage VTGS−1.6V).

A substantially linear proportional relationship of 1:1 is present between the drain current ID and the gate-source voltage VTGS, as shown in FIG. 5. The characteristic curve plotted in FIG. 5 is that of "HAF2001", manufactured by Hitachi corporation. In the graph, the gate-source voltage VGS corresponds to the gate-source voltage VTGS. Accordingly, ΔVDSGAP represents the drain current ID on the basis of the relationship as shown in FIG. 5. In FIG. 5, a resolution in the vicinity of ID=10A is approximately 60 mV/A. Specifically, when the drain current ID varies by 1 A, the gate-source voltage VTGS varies by 60 mV. When the drain current ID varies by ±5 A, the gate-source voltage VTGS varies by ±0.3 V. In the conventional power supply control device, this resolution corresponds to a resolution which corresponds to 60 mΩ of the shunt resistance RS.

When the drain current ID is zero, a curve of the drain-source voltage VDS is determined by only the circuit for charging the gate and the mirror capacitance. When the drain current ID flows, it is affected by an inductance LC of the circuit and a resistance RC of the whole circuit. With increase of the drain current ID, the curve of the drain-source voltage VDS rises. When the drain current ID greatly increases as in the case of the dead short-circuit, an ascending slope of the drain current ID shown in the graph with the horizontal axis of time scale and the vertical axis of ID current tends to a fixed value, which is determined by a charging rate of the gate charging circuit. Therefore, the curve of the gate-source voltage VTGS also converges. An ascending slope of the drain current ID, which is determined by a rise of the curve of the gate-source voltage VTGS when a variation of the gate-drain voltage VTGD is zero, is a limit slope.

Returning to FIG. 4, description will be given about an operation of the main control FETQA (the magnitude relation between a force to vary the drain-source voltage VDS and a force to vary the drain current ID) when the drive circuit 111 performs an off control.

When the source transistor Q5 in the drive circuit 111 shifts its state to an off state and the sink transistor Q6 shifts its state to an on state, the charge stored in the true gate TG is discharged through the internal resistor RG and a resistor R8, and the sink transistor Q6.

At this time, even if the gate charge is discharged and the gate-source voltage VTGS drops, during a time that the main control FETQA lies in operation in the ohmic region, the drain current ID is little influenced by the voltage drop. At this time, the drain-source voltage VDS also little varies.

When the main control FETQA enters in operation of the pinch off region, the gate charge discharging will lower the gate-source voltage VTGS and reduce the drain current ID. At this time, the drain current ID will maintain its current state that is set up under the condition determined by the external circuit. Therefore, the drain-source voltage VDS increases to charge the gate-drain capacity CGD, so that the electrical charges discharged from the gate are neutralized, to thereby eliminate their influence to the drain current ID. This phenomenon occurs due to the magnitude relation between a force to maintain the drain current ID and a force to maintain the drain-source voltage VDS. Specifically, it is caused by the fact that The former force is considerably larger than the latter force. Such a covering operation continues within a range within which the drain-source voltage VDS is variable.

Even if the drive circuit 111 performs an off-control during the course of increasing of the drain current ID, the drain current ID continues its increase so long as a variation (increase) of the drain-source voltage VDS is allowed since the drain-source voltage VDS varies (increase). At a time point where the drain-source voltage VDS is incapable of increasing, the drain current ID which is determined by only the discharging of the gate electrical charges. In other words, a stage where the drive circuit 111 performs the off-control, the drain current ID is little influenced by the off-control until the variation of the drain-source voltage VDS terminates. The on/off operation of the main control FETQA is based on the mechanism mentioned above.

When the gate charging circuit is changed to another gate charging circuit, the VDS curve also changes for the same load current. For this reason, it is necessary to always keep the gate charging current constant. If the gate charging current is reduced, the VDS curve shifts upward. The overheat cutting-off operation by the overheat protection function may be quickened if the drain-source voltage VDS is increased with respect to the drain current ID by utilizing this nature. An overheat cut-off quickening circuit (overheat cut-off quickening means) to be described later is designed by the utilization of this idea.

An operation of the power supply control device will be described on the basis of the considerations thus far made. The reference voltage generating means (REFERENCE FETQB and resistor Rr) will first be described. The main control FETQA and the REFERENCE FETQB form a current mirror circuit of 1000:1. When a source potential of the main control FETQA is equal to that of the REFERENCE FETQB, the drain current IDaA=1000×drain current IDaB.

Therefore, when the drain current IDaA of the main control FETQA=5 A and the drain current IDaB of the REFERENCE FETQB=5 mA, the drain-source voltage VDS of of the main control FETQA is equal to that of the REFERENCE FETQB, and the same thing is true for the gate-source voltage VTGS; VDSA=VDSB, and VTGSA=VTGSB. Here, VDSA and VDSB are drain source voltages of the main control FETQA and FET B, and VTGSA and VTGSB are the gate-source voltages of the main control FETQA and REFERENCE FETQB.

Accordingly, when the REFERENCE FETQB is saturated in a on state, a voltage substantially equal to the output voltage VB is applied to across the resistor Rr. Therefore, a load of the REFERENCE FETQB equivalent to a 5 A load connected to the main control FETQA, viz., resistance of the resistor Rr is: Rr=12 V/5 mA=1.5 kΩ.

A value (curve) of the drain-source voltage VDS when current of 5A flows into the main control FETQA is used as a reference value. The reference voltage generating means is reduced in size and hence a small chip occupying area is realized by constructing the reference voltage generating means by using the REFERENCE FETQB of which the transistor ratio (=current capacity ratio) is small with respect to the main control FETQA. Further, by fabricating the main control FETQA and the REFERENCE FETQB on a same chip by a same process, errors caused by deviation from specified values among manufacturing rots and temperature drifts are removed, thereby remarkably improving the detection accuracy.

An operation of the main control FETQA in the pinch off region will be described. When the main control FETQA shifts its OFF state to the ON state, the drain current IDQA rises toward the final load current value, which is determined by the circuit resistance. The gate-source voltage VTGSA takes a value determined by the drain current IDQA, and also rises while being braked by the mirror effect of the gate-drain capacity CGD, which is due to the lowering of the drain-source voltage VDSA. Further, the gate-source voltage VTGSB of the REFERENCE FETQB is determined through the operation of the REFERENCE FETQB as a source follower with the resistor Rr of 1.4 kΩ as its load.

The gate-source voltage VTGSA of the main control FETQA grows with increase of the drain current IDQA, and hence VTGSB<VTGSA. Since VDSA=VTGSA+VTGD, and VDSB=VTGSB+VTGD, VDSA−VDSB=VTGSA−VTGSB. VTGSA−VTGSB as the gate-source voltage difference indicates IDQA–IDQB as the drain current difference. Therefore, a difference between the drain current IDQA and the current IDQB flowing through the reference voltage generating means is obtained by detecting the difference VTGSA−VTGSB. As the VDSB becomes small (the VDSA also becomes small), the current IDQB approaches to 5 mA (this value corresponds to IDQA=5 A).

The drain-source voltage VDSB of the REFERENCE FETQB is directly input to the comparator CMP1, and the drain-source voltage VDSA of the main control FETQA is divided by the resistance R1 and the resistance R2 (in this case, resistance of the variable resistor RV is not considered), and the resultant is applied to the comparator CMP1. That is, th e voltage applied to the comparator CMP1 is given by $$VDSA \times R1/(R1+R2) \quad (1)$$

Immediately after the main control FETQA shifts its state to the on state, the VDSB of the REFERENCE FETQB>(1). With increase of the drain current IDQA of the main control FETQA, the value of the expression (1) decreases but exceeds the drain-source voltage VDSB. At this time, the output level of the comparator CMP1 shifts from an "H" level to a "L" level to turn off the main control FETQA.

The hysteresis characteristic of the comparator CMP1 is formed by the diode D1 and the resistor R5. When the main control FETQA is turned off, the gate potential is connected to ground by the sink transistor Q6 of the drive circuit 111, and a potential difference between the cathode of the diode D1 and the drain D of the main control FETQA is VDSA+ 0.7 V (voltage drop of the Zener diode ZD1 in the forward direction). Accordingly, current flows through a path of R1→r5→D1, and a potential at the + input terminal of the comparator CMP1 lowers to below that the drive circuit 111 performs the on control. Accordingly, the main control FETQA maintains the off state because VDSA−VDSB is lower than that when its state was shifted to an off state. As both VDSA and VDSB increase and approach to VB, the condition that expression (1) is smaller than VDSB is re-established and then it shifts its state to an on state. There are a variety of ways of forming the hysteresis characteristic, the above mentioned one is one example of those ways.

Assuming that the drain-source voltage VDSA present when the FET QA is turned off is designed as a threshold value VDSAth, the following relation holds $$VDSAth-VDSB=R2/R1 \times VDSB(at\ 5\ [mA]) \quad (2)$$

An overcurrent judging value is given by the equation (2). To change the overcurrent judging value, the resistance of the variable resistor RV, which is connected in parallel with the resistor R2 and which is located outside the chip 110a, is adjusted. Specifically, the overcurrent judging value may be reduced by decreasing the resistance of the variable resistor RV.

An operation of the main control FETQA in the ohmic region will be described. If the main control FETQA shifts its state to an on state in a normal wiring state, the main control FETQA successively maintains the on state. Therefore, the gate-source voltages VTGSA and VTGSB each reach about 10V, and both the thermal FETs QA and QB operate in the ohmic region.

In this region, the 1:1 relation between the gate-source voltage VGS and the drain current ID is lost. In the case of "HAF2001", by Hitachi corporation, the on resistance RDS (ON)=30 mΩ when VGS=10 V. Then, we have $$VDSB=5A \times 30m\Omega=0.15V\ VDSA=IDQA \times 30m\Omega VDSA-VDSB= 30m\Omega \times (IDQA-5A) \quad (3)$$

When the drain current IDQA increases by a short-circuit of the wiring, the value of the equation (3) increases, and when it exceeds the overcurrent judging value, the main control FETQA is placed to an off state. Thereafter, the main control FETQA enters the pinch off region in its operation, and it repeats the on and off states.

FIG. 6 is a waveform diagram showing waveforms of a voltage and a current in the main control FETQA used in the power supply control device, which is the present embodiment.

FIG. 6(a) shows a waveform of the drain current ID (A), and FIG. 6(b) shows a waveform of the drain-source voltage VDS. In those figures, (2) indicates the waveforms when the power supply control device normally operates; and (3) indicates the waveforms when an overload condition (including the short-circuit between the source and the load).

In a case that a overload condition occurs (waveforms (3)), the on/off control of the main control FETQA is repeated to cause the periodic heating of the main control FETQA so as to effect the overheat protection function.

As described above, in the power supply control device and the method of controlling the same, for the current detection, there is no need of using the shunt resistor connected in series to the power supply path, while the shunt resistor is indispensably used in the conventional power supply control device. The power supply control device can highly accurately detect an overcurrent without the shunt resistor. Additionally, the power supply control device enables the hardware circuit to successively detect not only the overcurrent arising from the dead short-circuit but also the abnormal current arising from the layer short-circuiting having some short-circuit resistance, such as layer short circuit.

In the case of the layer short-circuit, the power supply control device repeats the on/off control of the main control FETQA to greatly vary the current and to cause a periodic heating of the semiconductor switch. The periodic heating quickens the shutting off (off control) of the main control FETQA by the overheat protection function. Further, the on/off control of the semiconductor switch can be effected by use of only the hardware circuit not using the microcomputer. This feature leads to reduction of the device mounting space, and remarkable reduction of device manufacturing cost.

When comparing with the overcurrent detecting method in which the characteristic variation of the drain-source voltage VDS is utilized as in the present embodiment, but the present current is compared with a predetermined threshold value of current at predetermined timings, the overcurrent detection of the embodiment has the following advantages. Such circuit components as capacitors and a plurality of resistors are unnecessary. Therefore, there is eliminated detection errors caused by variations of circuit constants of those components. Further, there is no need of the capacitor mounted outside the chip 110a. The result is to reduction of the fabricating space and device fabricating cost.

With the adjustment of the variable resistor RV, it is possible to perfectly discriminate between the dead short-circuit and the layer short-circuit for the type of the load 102 (e.g., head lamps, drive motor, or the like). Protection against the short-circuit trouble is effected highly accurately.

Second Embodiment

A power supply control device and a method of controlling the same, which form a second embodiment of the present invention, will be described with reference to FIG. 7. The power supply control device of the second embodiment corresponds to that of the first embodiment additionally having resistors R3, R4, R6, R9 and FETs Q1 and Q2, and a Zener diode ZD2. A portion enclosed with a dotted line in FIG. 7 is an analog IC chip 110b onto which the circuit components within the enclosed portion are integrated.

The resistor R9 interconnects the gate and the source of the FET Q1. The true gate TG of the main control FETQA is connected to the gate of the FET Q1, through the Zener diode ZD2 and the resistor R6. The drain of the FET Q1 is connected to VB+5, through the resistor R4. The source of the FET Q1 is connected to the source SA of the main control FETQA. The resistor R1 is connected in parallel with a circuit in which the resistor R3 and the FET Q2. A voltage division of the drain-source voltage VDSA of the main control FETQA is varied through the on/off control of the FET Q2.

An operation of the power supply control device of the second embodiment will be described. The operation of it in the pinch off region will first be described. As in the first embodiment, the drain-source voltage VDSB of the REFERENCE FETQB is directly connected to the comparator CMP1. The drain-source voltage VDSA of the FET QA is divided by a parallel resistance (R1∥R3) of the resistor R1 and the resistor R3, which are connected in parallel, and the resistor R2 (here, the variable resistor RV is not taken into consideration), and is applied to the comparator CMP1.

Specifically, a voltage value given by the following expression is input to the comparator CMP1.

$$\text{VDSA} \times (R1\|R3)/((R\|R3)+R2) \tag{1'}$$

Immediately after the FET QA is turned on, VDSB>where VDSB is the drain-source voltage of the REFERENCE FETQB. With increase of the drain current IDQA of the FET QA, the value (1') the drain-source voltage VDSB of the REFERENCE FETQB. At this time, the output level of the comparator CMP1 shifts from an "H" level to a "L" level. As a result, the FET QA is turned off.

Assuming that the drain-source voltage VDSA appearing when the main control FETQA shifts its state to an off state is designated as a threshold value VDSAth, then the following relation holds.

$$\text{VDSAth-VDSB}=R2/(R1\|R3) \times \text{VDSB} \tag{2'}$$

An overcurrent judging value is determined by the equation (2'). To change the overcurrent judging value, the resistance of the variable resistor RV, which is connected in parallel with the resistor R2 outside the chip 110b, is adjusted. Specifically, the overcurrent judging value may be reduced by decreasing the resistance of the variable resistor RV.

The operation of the power supply control device in the ohmic region and the operation described with reference to FIG. 6 are substantially the same as those in the first embodiment, and hence no further description of them will be given.

The overcurrent judging value will be discussed. It is assumed that the overcurrent judging value for the pinch off region is equal to that for the ohmic region.

(VDSA−VDSB)/ΔID in the pinch off region will first be calculated. The following relations are derived from the characteristic curve of the HAF2001.

$$\Delta VTGSA/\Delta IDQA = 60 \,[\text{mV}/A] \tag{4}$$

$$\begin{aligned}\Delta VTGSA &= \Delta(VDSA - VDSB) \times 2CGD/(CGS + 2CGD) \\ &= \Delta(VDSA - VDSB) \times 2 \times 1200 \text{ pF}/ \\ &= (1800 \text{ pF} + 2 \times 1200 \text{ pF}) \\ &= \Delta(VDSA - VDSB) \times 0 \cdot 57\end{aligned} \tag{5}$$

Rearranging the equations (4) and (5), then we have $$(\text{VDSA}-\text{VDSB})/\Delta\text{ID}=105 [\text{mV}/A] \tag{6}$$

From the equation (3), Δ(VDSA−VDSB) /ΔID in the ohmic region is $$\Delta(\text{VDSA-VDSB})/\Delta\text{ID}=30 [\text{mV}/A] \tag{7}$$

When comparing the equation (6) with the equation (7), a current sensitivity in the pinch off region is higher than that in the ohmic region. An overcurrent judging value, even if it is appropriate in the ohmic region, is too small in the pinch off region. In this case, there is a danger that an overcurrent detection will frequently occur in this region. One possible measure to be taken for this is to switch the overcurrent judging value between the pinch off region and the ohmic region. This is implemented by the circuit added to the first embodiment circuitry.

Judgement as to whether the operation region of FET is the pinch off region or the ohmic region is made by amplitude of the gate-source voltage VTGSA. With increase of the drain current ID, the gate-source voltage VTGSA in the pinch off region grows. In this case, however, it never exceeds 5V even if a dead short-circuit occurs. Therefore, if VTGSA>5V, it is judged that the current operation region of the FET is the ohmic region.

Immediately after the FET QA is turned on, the FET Q1 is in an off state and the FET Q2 is in an on state. To turn on the FET Q2, a voltage, e.g., +5V, in excess of the output voltage VB is required.

Where a breakdown voltage of the Zener diode ZD2 is set at (5V−1.6V) (1.6V threshold voltage of the FET Q1), if VTGSA (gate-source voltage) >5V, the FET Q1 is turned on and the FET Q2 is turned off. Then, the resistor R3 coupled in parallel to the resistor R1 is removed out of the circuit.

Since a division ratio of the drain-source voltage VDSA is increased, a source-drain voltage difference VDSA−VDSB is which makes FETQA turn-off is more reduced more reduced. As a result, in the ohmic region, the overcurrent judgement is made at a smaller current than before the measure is taken.

However, no problem will arise in practical use if the measure by the additional circuit of the embodiment is not taken. Specifically, when the final load current value is small, the current completely rises within the pinch off region. In other words, the current reaches the final load current value within the pinch off region when the final load current is small. When the final load current is large, the current is still in the middle of rising within the pinch off region. Even in the case of the dead short-circuit, the current is limited to within about 40 A.

Thus, as the final load current value increases, the current variation converges to a current rise characteristic curve having a fixed slope. The difference of the drain-source voltage VDSA is not so large as one that will occur when each load current is fully saturated. Because of presence of this phenomenon, where the current sensitivity is large in the pinch off region, the drain-source voltage difference VDSA−VDSB does not grow large. Accordingly, if the current value in the reference voltage generating circuit is appropriately selected, a practical power supply control device with an overcurrent protection function is realized by use of the arrangement of the first embodiment even if the additional circuit as of the present embodiment is not used.

The thus arranged power supply control device and a method of controlling the same produce the useful effects comparable with those of the first embodiment already described in detail.

Finally, a basic concept of the overcurrent control will concisely be described. Firstly, when the wiring is normal, the FET QA is turned on and operates in the ohmic region. So long as the wire is normal, its operation continues in the ohmic region, and it maintains an on state. When the wiring is abnormal, the current increases, and when the drain-source voltage difference VDSA−VDSB exceeds the overcurrent judging value, the FET QA is turned off and operates in the pinch off region. So long as the abnormal wiring is present, the FET QA repeats the on and off states, and continues the operation in the pinch off region, and finally it is shut off by overheat.

To realize the basic concept and to optimize the overcurrent control, it is required that the overcurrent judging value satisfies the following two conditions. A first condition is that the FET QA is absolutely not turned off within the normal current range. A second condition is that after the current detected in the ohmic region is judged to be overcurrent, the FET QA continues the on and off states in the pinch off region so long as the abnormality in the wiring is not removed. This is needed for stabilizing the period of the on/off control. The stabilizing the period of the on/off control leads to a stability of the control. A timer is set by use of the period of the on/off control (see the sixth embodiment to be described later). Also to this end, the stabilization of the on/off control period is needed.

To satisfy the first and second conditions, the overcurrent judging value in the ohmic region is set at a current value of "normal current maximum value+α" (corresponding to (VDSA−VDSB), and the overcurrent judging value in the pinch off region is set at a current value of "normal current maximum value+β". At this time, α>β. That is, α−β is an offset quantity necessary to put the FET operation in the pinch off region.

Third Embodiment

A power supply control device and a method of controlling the same, which form a third embodiment of the present invention, will be described with reference to FIG. 8. A power supply control device of this embodiment is different from that of the power supply control device of the second embodiment (FIG. 7) in that the gate of the REFERENCE FETQB is not connected to the true gate TG of the FET QA, and a resistor R41 is additionally used as a gate resistor of the REFERENCE FETQB. The resistor R41 is connected at one end to the gate of the REFERENCE FETQB and at the other end to the gate G of the FET QA. The remaining circuit construction of the power supply control device of the embodiment is substantially the same as of the FIG. 7 circuit construction. In FIG. 8, a portion enclosed by a dotted line indicates an analog IC chip onto which the circuit components within the enclosed portion are integrated.

It is required that the resistance of the resistor R41 is set at 1000×RG. When RG=10KΩ, for example, R41=10MΩ. Since the resistance is extremely high, it is preferable, when the productivity is taken into consideration, that the ratio of the numbers of transistors is set at 1:100, and R41=1MΩ.

The operation of the power supply control device of this embodiment is substantially equal to that of the power supply control device of the second embodiment, and produces useful effects comparable with those by the power supply control device of the first embodiment.

Fourth Embodiment

A power supply control device and a method of controlling the same, which form a fourth embodiment of the present invention, will be described with reference to FIGS. 9 and 10. The power supply control device of this embodiment is directed to improvement of the voltage dividing means (R1, R2 and RV) in the circuitry of the power supply control device of the first embodiment (FIG. 1). As recalled, the voltage dividing means divides the drain-source voltage VDSA of the FET QA at a voltage division ratio based on the resistance value ratio and applies the divided voltage to the comparator CMP1. A portion 110a' enclosed by a dotted line in FIG. 9 and a portion 110a" enclosed by a dotted line in FIG. 10 indicate analog IC chips onto which the circuit components within the enclosed portions are integrated.

FIG. 9, in the power supply control device of this embodiment, the drain D and source SA of the FET QA are inserted in series in the path for applying the output voltage VB of the power source 101 to the load 102. A circuit section for driving the FET QA includes an REFERENCE FETQB, a transistor Q7, resistors R1 to R6, R8 to R10, RG, Rr, a Zener diode ZD1, diodes D1 to D3, a comparator CMP1, a drive circuit 111 and a switch SW1. The FET QA as the semiconductor switch, which is used in this embodiment, has a construction as shown in FIG. 2 as in the first embodiment. The functions and operations of the comparator CMP1, the drive circuit 111 and the switch SW1, and the generation of a reference voltage by the REFERENCE FETQB and the resistor Rr are also as in the first embodiment.

The functions and operations of a circuit portion (transistor Q7, resistors R1 to R6, and diodes D2 and D3), which are different from the corresponding one in the power supply control device of the first embodiment (FIG. 1) will be described.

The PNP transistor Q7 connected between the power source 101 and the resistor R1 is provided for coping with the dark current. In the power supply control device of the first embodiment (FIG. 1), a dark current path ranging from the power source 101 to the load 102 by way of the resistors R1 and R2 of the voltage dividing means even when an instruction to supply electric power to the load 102 is not issued, viz., when the FET QA is not driven. Therefore, even during the off state of the switch SW1, a little electric power of the power source 101 is consumed.

To reduce the power consumption of the power source 101 by the dark current, the transistor Q7 is provided and arranged such that only when the switch SW1 is turned on (an instruction to supply power source to the load 102 is issued), the transistor Q7 is turned on. That is, when the switch SW1 is not turned on, the transistor Q7 is placed in an off state, to thereby cut off the path of the dark current. Thus, when the transistor Q7 is in the off state, the current which otherwise flows through a path of R1 (resistor)→R3 (resistor)→R2 (resistor)→GND (ground), a path of R1 (resistor)→D3 (diode)→R5 (resistor)→load 102→GND (ground), and a path of R1 (resistor)→R3 (resistor)→D2 (diode)→R6 (resistor)→Rr (resistor)→GND (ground).

The resistors R1 to R6, and diodes D2 and D3 make up a diode clamp circuit. Assuming that a potential at the node of the resistors R1 and R3 is VC, and a potential at the node of the resistors R3 and R2 is VE, VC>VE when the transistor Q7 is in an on state.

If VSA≧VC−0.7V (VSA:source voltage of the FET QA), the source voltage VSA is input to the "+" input terminal of the comparator CMP1. If VSA<VC−0.7V, the voltage of "VC−0.7V" is input to the "+" input terminal of the comparator CMP1, irrespective of the source voltage VSA. In other words, even of the source voltage VSA drops, the "+" input terminal of the comparator CMP1 is clamped at "VC−0.7", and does not lower below that voltage. The "−" input terminal of the comparator CMP1 is also clamped at "VE−0.7V", even if the source voltage VSB of the REFERENCE FETQB drops below "VE−0.7V".

With provision of the diode clamp circuit, even when the FET QA and the REFERENCE FETQB are turned off and the source voltages VSA and VSB drop, the "+" and "−" input terminals of the comparator CMP1 are clamped at (VC−0.7V) and (VE−0.7V). Since VC>VE, the output signal level of the comparator CMP1 is set at an "H" level, and hence the FET QA may reliably be turned on independently of the amplitudes of the source voltage VS and the source voltage VB. Further, the voltage withstanding of the "+" and "−" input terminals of the comparator CMP1 is improved since the potentials at those input terminals of the comparator CMP1 never drop below a predetermined value of potential.

In the power supply control device of FIG. 10, the gate of the REFERENCE FETQB is not connected to the true gate TG of the FET QA, and a resistor R41 is additionally used as a gate resistor of the REFERENCE FETQB. The resistor R41 is connected at one end to the gate of the REFERENCE FETQB and at the other end to the gate G of the FET QA. The setting of the resistor R41 and others are the same as those in the third embodiment already described.

Fifth Embodiment

A power supply control device and a method of controlling the same, which form a fifth embodiment of the present invention, will be described with reference to FIGS. 11 and 12. A power supply control device of this embodiment corresponds to the power supply control device of the first embodiment (FIG. 1) to which a rush current mask circuit 105 and an overheat cut-off quickening circuit 106 are added. A portion 110d enclosed by a dotted line in FIG. 11 and a portion 110d' enclosed by a dotted line in FIG. 12 indicate analog IC chips onto which the circuit components within the enclosed portions are integrated.

When the load 102 (e.g., head lamps) is turned on, a rush current flows through the power (source) supply control device. A value of the rush current amounts to several to several tens times as large as a current value the current flowing in a stable state of the circuit. A period of time of the flowing of the rush current depends on a type and capacity of the load 102, usually 3 to 20 msec. If the overcurrent control as described in the first, second or third embodiment is performed during the rush-current flowing period, some time is taken until the load 102 settles down. This appears as unwanted phenomena; the turning on of the head lamp delays and a response of the load per se is slow. This embodiment solves the problem by adding the rush current mask circuit 105 ("inhibiting means" in claims) to the circuit of FIG. 1.

In the first, second, third or fourth embodiment, when an overcurrent arising from a dead short-circuit is detected, the overheat protection function operates to cut off the FET QA (off control). In the case of the layer short-circuit, the on/off control of the FET QA is repeated. The resultant periodic heating of the FET QA makes the overheat cutting-off function effective. Accordingly, a time taken for the cutting-off function to be effective will be relatively long. In the present embodiment, the overheat cut-off quickening circuit 106 (overheat cut-off quickening means) quickens the cutting off of the FET QA even in the case of the layer short.

In FIG. 11, the rush current mask circuit 105 includes the FETs Q11 and Q12, a diode D11, resistors R11 to R13, and a capacitor C11.

An operation of the rush current mask circuit 105 will be described. When the FET QA is turned on, the gate-source voltage VGSA is applied through the diode D11 and the resistor R12 to the gate of the FET Q12, and also to the gate of the FET Q11 through the diode D11 and the resistor R11.

The gate of the FET Q12 is connected to the source SA of the FET QA. Immediately after the FET QA is turned on, the capacitor C11 is not yet charged. Accordingly, a gate potential of the FET Q12 insufficiently rises, and the FET Q12 fails to shift its state to an on state. The FET Q11 maintains its on state during the off state of the FET Q12, and couples the "−" input terminal of the comparator CMP1 with the source SA of the FET QA. Therefore, the output level of the comparator CMP1 is kept at an "H" level, and in this state the FET QA is not turned off if a large rush current flows.

With time lapse, charging of the capacitor C11 through the resistor R12 progresses, and finally the FET Q12 shifts its state to an on state. With the turn on of the FET Q12, the FET Q11 is turned off and the masking state terminates, and the overcurrent detecting control functions.

The resistor R13 is a discharging resistor for discharge and resetting the capacitor C11 after the FET QA is turned off. In this case, selection of R12<<R13 is desirable in order that the discharging operation of the capacitor C11 does not affect the mask time. The mask time is determined by a time constant of R12×C11. This implies that when the circuit is fabricated into one chip, the mask time may be adjusted by properly changing the capacitance of the capacitor C11.

The overheat cut-off quickening circuit 106 is made up of FET Q21 to Q24, diodes D21 and D22, a Zener diode ZD21, and resistors R21 to R27.

An operation of the overheat cut-off quickening circuit 106 will be described. The power supply control device is placed to an overcurrent control mode, the gate drive circuit periodically performs an on/off control, and the gate potential of the FET QA becomes the potential of an "L" level. During this time period with the source voltage VSA being in some amount of voltage a capacitor C21 is charged through the transistors Q22 and Q24 and the resistor R22. The gate potential of the FET Q21 is below a threshold value in an initial stage. With progress of charging the capacitor C21, the gate potential rises and the FET Q21 is turned on.

Current flows from the terminal TG (true gate of the FET QA) to ground (GND) by way of the resistor R21, and electrical charges stored in the terminal TG is decreased in amount. Therefore, the drain-source voltage VDSA increases also with respect to the load resistor. Power consumption by the FET QA increases to quicken the overheat cutting off operation. The smaller the resistance of the resistor R21 is, the faster the overheat cutting-off operation is. The resistor R23 is a discharging resistor for the capacitor C21. Selection of R22<<R23 is preferable.

The power supply control device shown in FIG. 12 corresponds to the power supply control device of the fourth embodiment (FIG. 9) to which a rush current mask circuit 105' and an overheat cut-off quickening circuit 106' are added. The circuit arrangements of the rush current mask circuit 105' and the overheat cut-off quickening circuit 106' and the operations of them are substantially the same as those of the corresponding ones shown FIG. 11.

Sixth Embodiment

A power supply control device of a sixth embodiment of the present invention will be described with reference to FIGS. 13 and 14. The power supply control device of this embodiment corresponds to the power supply control device of the first embodiment (FIG. 1) in which an on/off-time accumulating circuit 107 is additionally used. A portion 110e enclosed by a dotted line in FIG. 13 and a portion 110e' enclosed by a dotted line in FIG. 14 indicate analog IC chips onto which the circuit components within the enclosed portions are integrated.

In the first, second, third or fourth embodiment, in the case of the layer short-circuit, the on/off control of the FET QA is repeated, and the resultant periodic heating action of the FET QA causes the overheat cutting-off to function. Therefore, a time taken for the cutting off function to be effective is relatively long. This problem is solved by this embodiment in the following manner. To be specific, an on/off-time accumulating circuit (time control means) 107 for causing the power supply control device to perform the off control when the number of on/off controls of the FET QA reaches a predetermined number is additionally used, whereby the cutting off of the FET QA is quickened.

In FIG. 13, the on/off-time accumulating circuit 107 is made up of transistors Q31 to Q34, diodes D31 to D33, a Zener diode ZD31, resistors R31 to R37, and a capacitor C31.

An operation of the on/off-time accumulating circuit 107 will be described. The power supply control device is placed to the overcurrent control mode, the capacitor C31 is charged through the transistors Q32 and Q34 and the resistor R32 every time the off-control is performed (the gate potential is set at an "L" level) during the on/off operations of the FET QA. The capacitor C31 is charged only when the drain-source voltage VDSA is set at the "H" level during the off-control (the gate potential is set at the "L" level). When the on- or off-control is consecutively performed, it is not charged. The gate potential of the FET Q31 is below a threshold value and hence it is in an off state. When the gate potential rises with progress of the charging of the capacitor C31, the FET Q31 is turned on. At this time, anode of a temperature sensor 121 (consisting of four diodes)is lowered in potential. As a result, the same condition as at high temperature is set up, the overheat cut-off FET QS is turned on, and the FET QA is cut off (off-control).

A cut-off time by the on/off time accumulation is preferably about 1 second. To stably operate the on/off-time accumulating circuit 107, it is necessary to stabilize the on/off control period of the FET QA. In the present embodiment, a variation of the drain-source voltage VDSA of the FET QA with respect to a variation of the load current in the pinch off region is greater than that in the ohmic region. Because of this, it is turned of f in the pinch off region during the on/off control (there is no case that it is turned off in the ohmic region following the pinch off region). Accordingly, the period of the on/off control of the FET QA is stable.

In the power supply control device of the present embodiment, in the on/off-time accumulating circuit 107, the number of on/off controls of the FET QA is judged by an amount of electric charge stored in the capacitor C31. Alternatively, the on/off-time accumulating circuit may be constructed by use of a counter which directly counts an output signal of the drive circuit 111. In this case, when a count value of the counter for counting the output signal of the drive circuit 111 reaches a predetermined value, the overheat cut-off FET QS is turned on to cut off the FET QA (off control).

FIG. 14 is a circuit diagram showing a circuit arrangement in which an on/off-time accumulating circuit 107' is added to the power supply control device of the fourth embodiment.

The circuit arrangement and operations of the on/off-time accumulating circuit 107 are substantially the same as those of the fourth embodiment of the invention (FIG. 9).

Additionally, in the power supply control device of the sixth embodiment (as shown in FIGS. 13 and 14), after counting the output signal by the on/off-time accumulating circuit 107, the overheat cut-off function, which is constituted of the temperature sensor 121, a latch circuit 122 and the overheat cut-off FETQS (as shown in FIG. 2), controls the main control FETQA to the OFF state. However, the present invention could employ the following modification. Namely, according to a first modification, the drain of the FETQ31 is connected to the real gate (TG) of the main control FETQA via a series circuit of a diode and a resistor. In a second modification, the prohibited gate (binary input AND gate) is provided on the output of the comparator CMP1 and the drain voltage of the FETQ31 is used for prohibited control signal.

Additionally, in a third modification, the drain of the FETQ31 is connected to "+" input terminal of comparator CMP1 via a series circuit of a diode and a resistor.

In these modifications, the resistor R31 will be omitted, and in order to keep the information such that the on/off-time accumulating circuit 107 cuts off the main control FETQA, the latch circuit which is composed of a PMOSFET and resistors must be added.

The source of the PMOSFET is connected to power supply voltage VB and the drain of the PMOSFET is connected to the gate of the FETQ31, and then the gate of the PMOSFET is connected to the drain of the FETQ31 and the source of itself via resistors respectively.

A modification of the a power supply control device and a method of controlling the same, which are each of the first to sixth embodiments, will be described with reference to FIG. 15. In each of the above-mentioned embodiments, the reference voltage generating means is set a fixed voltage value. When the load is varied, the reference voltage generating means copes with the load variation by correspondingly varying the overcurrent judging value.

Specifically, the resistances R1 to R3 are set in accordance with the maximum load used when those are fabricated into a semiconductor chip. When the load 102 is small, the variable resistor RV is located outside the chip while being connected in parallel with the resistor R2, whereby the overcurrent judging value is lowered.

This method has the following problems. A first problem is that control accuracy decreases with increase of the overcurrent judging value. A second problem is that it is necessary to change the overcurrent judging value between the pinch off region and the ohmic region. In this case, the overcurrent judging value for the pinch off region, to be exact, must be set in accordance with an ascending slope of the drain current ID. An ascending slope of the drain current ID varies when the wire inductance and the wire resistance-vary. It is difficult accurately set the over current judging value.

To cope with this, it is effective to set the reference voltage generating means in accordance with the load 102. To this end, the reference voltage generating means is set to a voltage value corresponding to a current value in excess of the maximum current value of the load 102.

When the drain-source voltage on the load drive transistor (i.e., the drain-source voltage VDSA of the FET QA) exceeds the drain-source voltage VDS of the reference voltage generating means (i.e., the drain-source voltage VDSB of the REFERENCE FETQB), even if its excess is minute, it is judged that it is an overcurrent value.

In this method, the same overcurrent judging value may be used for both the pinch off region and the ohmic region. In other words, even if the operation region of the FET shifts from the pinch off region to the ohmic region and vice versa, there is no need of changing the overcurrent judging value. Further, in the method, the overcurrent may be judged by judging whether or not the drain-source voltage of the load drive transistor exceeds the drain-source voltage VDS of the reference voltage generating means. Therefore, its detection accuracy is determined by only the resolution of the comparator CMP1.

Further, there are eliminated adverse effects by temperature drift, variations among different IC lots, wiring inductance and wiring resistor, and it is not affected by a power source voltage variation so long as the comparator CMP1 normally operates. Thus, a power supply control device and a method of controlling the same, which have few error factors (substantially free from error factors), are successfully realized.

The methods of setting reference voltage generating means and of changing the setting thereof may be summarized as follows:

a) The external variable resistor RV is connected in parallel with the resistor Rr.

b) The resistor Rr is located outside the chip, and it is used for setting the reference voltage generating means and selecting related values in accordance with the specification used.

c) A resistance of the resistor Rr is varied.

As shown in FIG. 15, a plurality of resistors Rr1 to Rr4 is disposed in parallel within the chip. In the stage of chip packaging or the pair chip mounting, the set value (reference) of the reference voltage generating means may be set to a target specification by selecting a proper one of those resistors by means of a switch SW2. With this, in integrating the power supply control device onto a semiconductor chip, one chip may cover a plurality of specifications. With the variable setting of the variable resistor RV, it is possible to perfectly discriminate between the dead short-circuit and the layer short-circuit for the type of the load 102 (e.g., head lamps, drive motor, or the like). Protection against the short-circuit trouble is effected highly accurately.

Seventh Embodiment

A power supply control device according to a seventh embodiment of the present invention will be described with reference to FIGS. 16 and 17.

The power supply control device of FIG. 16 corresponds to the power supply control device of the fourth embodiment (FIG. 9) in which the thermal FETs QA and QB are of the p-channel type. The power supply control device of FIG. 17 corresponds to the power supply control device of the fourth embodiment (FIG. 9) in which the thermal FETs QA and QB are IGBTs (insulated gate bipolar transistors). A portion 110*ap* enclosed by a dotted line in FIG. 16 and a portion 110*ai* enclosed by a dotted line in FIG. 17 indicate analog IC chips onto which the circuit components within the enclosed portions are integrated.

Eighth Embodiment

A power supply control device and a method of controlling the same, which form an eighth embodiment of the present invention, will be described with reference to FIG. 18. The power supply control device of this embodiment is a power supply control device having such a circuit arrangement that a too-small or minute current detecting function is applied to a circuitry formed by composing the power supply control devices of the first, fifth and sixth embodiment.

The drain D and the source S of a FET QA as a semiconductor switch is inserted in series in a path for applying the output voltage VB of the power source 101 to the load 102. In FIG. 18, a section for driving the main control FET QA contains reference FETs QB and second reference QC, resistors R1, R2, R5, RG, R10, Rn, Rr2, a Zener diode ZD1, a diode D1, compactors CMP1 and CMP2, a drive circuit 111, and a switch SW1. In FIG. 18, a portion enclosed by a dotted line indicates an analog IC chip onto which the circuit components within the enclosed portion are integrated.

The FET QA as the semiconductor switch, as in the first embodiment, is constructed as shown in FIG. 2. The functions and operations of a charge pump 305, a cut-off latch circuit 306, a comparator CMP1, a drive circuit 111, a switch SW1 and others, and the generation of a reference voltage by the REFERENCE FETQB and the resistor Rr are also similar to those in the first embodiment. A masking circuit 303 for avoiding the judgement of the rush current flow is substantially the same as the rush current mask circuit 105 in the fifth embodiment. An on/off-time accumulating circuit 304 for performing a cut-off control by accumulating the number of on/off operations is substantially the same as of the on/off-time accumulating circuit 107 in the sixth embodiment.

The circuit section (SECOND REFERENCE FETQC, resistor Rr2, comparator CMP2) for realizing the additional minute current detecting function will now be described about the circuit function and operation.

The FET (third semiconductor switch) QC and the resistor (third load) Rr2 are involved in the word "second reference voltage generating means" used in claims. The drain and gate of the SECOND REFERENCE FETQC are respectively connected to the drain D and the true gate TG of the FET QA. The source SC of the SECOND REFERENCE FETQC is connected to one of the terminals of the resistor Rr2. The other end of the terminals of the resistor Rr2 is connected to ground (GND). Thus, the drain D and the true gate TG are used in common for both the thermal SECOND REFERENCE FETQC and the FET QA. This makes it easy to fabricate those FETs into a same semiconductor chip.

The SECOND REFERENCE FETQC and MAIN CONTROL FET QA, like that(REFERENCE FETQB) in the first embodiment, are fabricated on the same chip by a same process. A current detection, as in the first embodiment, is based on a detection of a difference between a voltage V DSA across the drain-source path of the main control FETQA and a reference voltage, and a second reference voltage, the detection being carried out by the comparators CMP1 and CMP2. Therefore, fabrication of the FETs QA, QB and QC into the same chip will eliminate (reduce) the error caused by common mode deviation in the current detection, viz., unwanted effects by drifts of the power source voltage and temperature, and variations among different manufacturing lots. Additionally, the mounting of the resistor (second load) Rr1 and resistor (third load) Rr2 outside the chip 110*af* makes the reference voltage insensitive to temperature variations of the chip 110*f*, realizing highly accurate current detection.

In order that a current capacity of the SECOND REFERENCE FETQB is smaller than that of the main control FETQA, ratios of the numbers of parallel-connected transistors which form those FETs are selected to be:

(number of transistors of the SECOND REFERENCE FETQC:1 transistor)<(number of transistors of the main control FETQA:1000 transistors)

A resistance value of the resistor Rr2 is set to be (resistance value of the load 102 when an extremely small current flows)×(number of transistors of the main control FETQA:1000 transistors/number of transistors of the SECOND REFERENCE FETQC: 1transistor).

The comparator CMP2 forms a part of "second detecting means" used in claims. The source voltage VSA of the FET QA is applied to the "+" input terminal of the comparator CMP2, and the source voltage VSC of the SECOND REFERENCE FETQC is applied to the "−" input terminal of the same. When a potential applied to the "+" input terminal is higher than that at the "−" input terminal, the output of the comparator is valid ("H" level). When a potential applied to the "+" input terminal is lower than that at the "−" input terminal, the output of the comparator is valid ("L" level).

Finally, the features and useful effects of the a power supply control device and a method of controlling the same, which form the eighth embodiment of the present invention, will be given. Firstly, there is no need of using the shunt resistor for current detection, and this leads to reduction of power consumption by the power source supply path. This feature is useful when it is applied to a large current circuit. Secondly, a dynamic detecting system is employed which utilizes the pinch off region of the semiconductor switch (FET QA). Because of this, a current sensitivity is high (approximately 105 mV/A), and hence current detection accuracy is high. Thirdly, the on/off control of the semiconductor switch (FET QA) can be performed with a simple drive control. Use of the overheat cut-off function and the on/off-time accumulating circuit 304 realizes high-speed processing when compared with a software (program) using a microprocessor. Fourthly, one chip fabrication of the circuitry is easy, and if so done, the device circuit is small, the mounting space is reduced, and cost to manufacture is reduced. Fifthly, the current detection is based on the detection of a difference between the drain-source voltage VDSA of the FET QA and the reference voltage, and the second reference voltage. Therefore, fabrication of the FETs QA, QB and QC into the same chip will eliminate the error caused by common mode deviation in the current detection, viz., unwanted effects by drifts of the power source voltage and temperature, and variations among different manufacturing lots.

As described above, in a power supply control device and a method of controlling the same, which are constructed according to the present invention, when the power supply from the power source to the load is controlled in a switching manner by the semiconductor switch, reference voltage generating means (reference voltage generating step) generates a reference voltage having a voltage characteristic substantially equivalent to that of a voltage between the terminals of the semiconductor switch being connected to a predetermined load. Detecting means (detecting step) detects a difference between the voltage between the terminals of the semiconductor switch and the reference voltage. Control means (control step) performs an on/off control of the semiconductor switch in accordance with the difference between the voltage between the terminals of the semiconductor switch and the reference voltage. The reference voltage generating means includes a circuit connected in parallel with the semiconductor switch and the load, the circuit containing a series circuit consisting of a second semiconductor switch and a second load, and generates a voltage between the terminals of the second semiconductor switch as the reference voltage. An offset of a voltage between the terminals of the semiconductor switch (viz., current of the power supply path) as a part of the power supply path, from a normal one is judged by detecting a difference between a voltage between the terminals of the semiconductor switch and a reference voltage generated by the reference voltage generating means (reference voltage generating step). Accordingly, there is no need of the shunt resistor connected in series to the power supply path, while the shunt resistor is indispensably used in the conventional power supply control device. Further, the heat loss of the device may be suppressed. Additionally, the power supply control device enables the hardware circuit or a software process by the microcomputer to successively detect not only the overcurrent arising from the dead short-circuit but also the abnormal current arising from the layer short-circuit, such as an imperfect short-circuit having a certain amount of resistance occurs. In particular when the on/off control of the semiconductor switch is constructed by a hardware circuit, there is no need far the microcomputer, and this leads to reduction of the mounting space and device manufacturing cost.

In the invention, second reference voltage generating means includes a circuit, connected in parallel with the semiconductor switch and the load, containing a series circuit consisting of a third semiconductor switch and a third load, and generates a voltage between the terminals of the third semiconductor switch as a second reference voltage, and second detecting means detects a difference between the voltage between the terminals of the semiconductor switch and the second reference voltage. Therefore, the second detecting means detects a too-small or minute current if a voltage characteristic of the reference voltage of the second reference voltage generating means is substantially equivalent to a voltage characteristic in a state that a target current, which is below a minimum current within a normal operation range, flows into the semiconductor switch and the load.

In the invention, a current capacity of the second or third semiconductor switch is smaller than that of the semiconductor switch, and a resistance ratio of the load and the second or third load is substantially inversely proportional to a current capacity ratio of the semiconductor switch and the second or third semiconductor switch. Therefore, the circuit constructions of the reference voltage generating means including the second semiconductor switch and the second load and the second reference voltage generating means including third semiconductor switch and the third load are reduced in size. This leads to reduction of the packaging space and device manufacturing cost.

In the invention, tenth power supply control device, the second or third load includes a plurality of resistors, and those resistors are selectively connected or a variable resistor is connected in parallel to the second or third load. Resistance of the second or third load is equivalently varied by varying the resistance of the variable resistor. The voltage between the terminals of the semiconductor switch is divided by the voltage dividing means at a voltage division ratio based on the resistance ratio, and the resultant is applied to the detecting means. With this, one chip may cover a plurality of specifications. And it is possible to perfectly discriminate between the dead short-circuit and the imperfect short-circuit for the type of the load. Protection against the short-circuit trouble is effected with high precision.

In the invention, an overheat protector (overheat protecting step) is further provided for protecting the semiconductor switch by performing an off-control of the semiconductor switch when the semiconductor switch is excessively heated. When an imperfect short-circuit having some short-circuit resistance occurs, the controller (control step, viz., the off control step and on control step) repeats the on/off control of the semiconductor switch to greatly vary the current. At this time, the semiconductor switch is periodically heated to quicken the cutting off of the semiconductor switch by the overheat protector (overheat protecting step). In the conventional power supply control device, only the software process using the microcomputer, for example, is permitted for dealing with the abnormal current caused when the layer short-circuit occurs. On the other hand, the power supply control device of the invention can deal with the abnormal current by the hardware circuit contained therein, not the external control using the microcomputer. This feature leads to simplification of the circuit and reduction of manufacturing cost. With this, a high response to the abnormal current at the time of the imperfect short-circuit is realized.

In the invention, the semiconductor switch, the second semiconductor switch, the reference voltage generator the detector, the controller, the second reference voltage generator, the second detector or the overheat protector are integrated onto a single chip. This leads to reduction of the device circuit construction, mounting space, and manufacturing cost. A current detecting method of the invention is based on the detection of a difference between a voltage between the terminals of semiconductor switch and a reference voltage or the second reference voltage, which is carried out by the detecting means or the second detecting means. Therefore, with fabrication of the semiconductor switch and the second or third semiconductor switch on a same chip, it is possible to eliminate (reduce) the error caused by common deviation in the current detection, viz., unwanted effects by drifts of the power source voltage and temperature, and variations among different manufacturing lots. Additionally, the mounting of the second or third load outside the chip makes the reference voltage or the second reference voltage insensitive to temperature variations of the chip, realizing highly accurate current detection.

In the invention, the period of the on/off control of the semiconductor switch by the control means is used as a control clock signal. With this feature, there is no need of using an oscillating circuit used exclusively for the clock signal generation. Since the period of the on/off control of the semiconductor switch (FET) is stable, and a stable clock signal is produced.

In the invention, the inhibitor (inhibiting step) is further provided for inhibiting the controller from performing the on/off control by the semiconductor switch during a fixed time period after the semiconductor switch is turned on. It inhibits the overcurrent control when a rush current flows at the start of the load. A slow of the load response is reduced.

In the invention, overheat cut-off accelerator (control step) is further provided for quickening the off control by the overheat protector (overheat protecting step) when the control means performs the on/off control of the semiconductor switch. Therefore, it quickens the cutting off of the semiconductor switch at the time of the layer short-circuit, and a quick response is realized.

Further, in the invention, time control means (time control step) is further provided which operates such that the time control means accumulates the number of on/off controls of the semiconductor switch by the control means (in control step), and when the number of on/off controls reaches a predetermined number of times, the time control means performs an off control of the semiconductor switch. Therefore, even in the case of the layer short-circuit, the cutting off of the semiconductor switch is quickened and the switch is cut off at a preset time.

What is claimed is:

1. A power supply control device comprising:
   a semiconductor switch responding to a control signal applied to a control signal input terminal thereof to be switched and controlling the supply of electric power from a power supply to a load;
   a reference voltage generator, connected in parallel to said semiconductor switch and operative to generate a reference voltage having a voltage characteristic substantially equivalent to that of a voltage between terminals of said semiconductor switch;
   a detector operative to detect a difference between the voltage of the terminals of said semiconductor switch and said reference voltage; and
   a controller operative to perform an on/off control of said semiconductor switch in accordance with said difference between the voltage of the terminals of said semiconductor switch and said reference voltage,
   wherein when the voltage across the terminals of said semiconductor switch is lower than the reference voltage, said controller performs the on/off control of said semiconductor switch, and when said controller continues performing the on/off control for a predetermined time or a predetermined number of times, the semiconductor switch is turned off.

2. A power supply control device in accordance with claim 1, wherein said reference voltage generator includes a circuit connected in parallel with said semiconductor switch and said load, said circuit contains a series circuit including a second semiconductor switch and a second load, and generates a voltage between the terminals of said second semiconductor switch as said reference voltage.

3. A power supply control device in accordance with claim 1, wherein a voltage characteristic of the reference voltage of said reference voltage generator is substantially equivalent to a voltage characteristic in a state where a target current, which is in excess of a maximum current within a normal operation range, flows into said semiconductor switch and said load.

4. A power supply control device in accordance with claim 2, wherein a transient voltage characteristic of a voltage between the terminals of said semiconductor switch when said semiconductor switch shifts its state from an off state to an on state is equivalent to the corresponding one when said second semiconductor switch shift its state from an off state to an on state.

5. A power supply control device in accordance with claim 2, wherein a current capacity of said second semiconductor switch is smaller than that of said semiconductor switch, and a resistance ratio of said load and said second load is substantially inversely proportional to a current capacity ratio of said semiconductor switch and said second semiconductor switch.

6. A power supply control device in accordance with claim 1, further comprising:
   a second reference voltage generator operative to generate a second reference voltage having a voltage characteristic substantially equivalent to a voltage characteristic of the voltage between the terminals of said semiconductor switch, said second reference voltage being a voltage between the terminals of a third semiconductor switch, said second reference voltage generator including a circuit, connected in parallel with said semiconductor switch and said load, containing a series circuit composed of said third semiconductor switch switched in accordance with said control signal and a third load; and a second detector operative to detect a difference between said voltage between the terminals of said semiconductor switch and said second reference voltage.

7. A power supply control device in accordance with claim 6, wherein a voltage characteristic of the reference voltage of said second reference voltage generator is substantially equivalent to a voltage characteristic in a state that a target current, which is below a minimum current within a normal operation range, flows into said semiconductor switch and said load.

8. A power supply control device in accordance with claim 6, wherein a transient voltage characteristic of a voltage between the terminals of said semiconductor switch when said semiconductor switch shifts its state from an off state to an on state is equivalent to the corresponding one when said third semiconductor switch shift its state from an off state to an on state.

9. A power supply control device in accordance with claim 6, wherein a current capacity of said third semiconductor switch is smaller than that of said semiconductor switch, and a resistance ratio of said load and said third load is substantially inversely proportional to a current capacity ratio of said semiconductor switch and said third semiconductor switch.

10. A power supply control device in accordance with claim 2, wherein one of said second and third loads includes a plurality of resistors and a resistance value of one of said second and third loads is adjustable by selectively connecting said plurality of resistors.

11. A power supply control device in accordance with claim 2, wherein one of said second and third loads includes variable resistors connected in parallel and a resistance value of one of said second and third loads is adjustable by said variable resistors.

12. A power supply control device in accordance with claim 2, further comprising:
a voltage divider operative to divide a voltage between the terminals of said semiconductor switch at a voltage division ratio based on a resistance value ratio, and for applying the resultant voltage to said detector, and said voltage division ratio of said voltage divider is adjusted through a resistance value variation.

13. A power supply control device in accordance with claim 1, wherein said controller performs an off control of said semiconductor switch when a difference between the detected terminal-to-terminal voltage and said reference voltage exceeds a first threshold value, and an on control of said semiconductor switch when a difference between the detected terminal-to-terminal voltage and said reference voltage is below said second threshold value.

14. A power supply control device in accordance with claim 1, further comprising:
an overheat protector operative to protect said semiconductor switch by performing an off-control of said semiconductor switch when said semiconductor switch is excessively heated over a predetermined value.

15. A power supply control device in accordance with claim 14, wherein said semiconductor switch, said reference voltage generator, said detector, said controller, said second reference voltage generator, said second detector and said overheat protector are fabricated on a single chip.

16. A power supply control device in accordance with claim 15, wherein said second load within said reference voltage generator and said third load within said second reference voltage generator are mounted outside said chip.

17. A power supply control device in accordance with claim 1, wherein a period of the on/off control of said semiconductor switch by said controller is used as a control clock signal.

18. A power supply control device in accordance with claim 1, further comprising:
an inhibitor operative to inhibit said controller from performing the on/off control by said semiconductor switch during a fixed time period after said semiconductor switch is turned on.

19. A power supply control device in accordance with claim 14, further comprising:
an overheat cut-off accelerator operative to accelerate the off control by said overheat protector when said controller performs the on/off control of said semiconductor switch.

20. A power supply control device in accordance with claim 1, further comprising:
a timer control which operates such that said timer control accumulates the number of on/off controls of said semiconductor switch by said controller, and when the number of on/off controls reaches a predetermined number of times, said timer control performs an off control of said semiconductor switch.

21. A method of controlling a power supply control device having a first semiconductor switch which responds to a control signal applied to a control signal input terminal to be switched and controls the supply of electric power from a power supply to a load, said method comprising the steps of:
generating a reference voltage from a second semiconductor switch which has a voltage characteristic substantially equivalent to that of a voltage between the terminals of said first semiconductor switch;
detecting a difference between the voltage between the terminals of said first semiconductor switch and said reference voltage;
performing an on/off control of said first semiconductor switch in accordance with said difference between the voltage between the terminals of said first semiconductor switch and said reference voltage.

22. A method of the power supply control device in accordance with claim 21, wherein in said reference voltage generating step, a voltage characteristic of the reference voltage is substantially equivalent to a voltage characteristic in a state that a target current, which is in excess of a maximum current within a normal operation range, flows into said first semiconductor switch and said load.

23. A method of the power supply control device in accordance with claim 21, wherein the act of controlling includes:
performing an off control of said first semiconductor switch when a difference between the detected terminal-to-terminal voltage and said reference voltage exceeds a first threshold value; and
performing an on control of said first semiconductor switch when a difference between the detected terminal-to-terminal voltage and said reference voltage is below said second threshold value.

24. A method of the power supply control device in accordance with claim 21, further comprising:
protecting said first semiconductor switch by performing an off-control of said first semiconductor switch when said first semiconductor switch is excessively heated.

25. A method of the power supply control device in accordance with claim 21, further comprising:
an inhibiting step for inhibiting a controller from performing the on/off control by said first semiconductor switch during a fixed time period after said first semiconductor switch is turned on.

26. A method of the power supply control device in accordance with claim 24, further comprising:

accelerating the off control of said first semiconductor switch when the semiconductor switch on/off control is performed.

27. A method of the power supply control device in accordance with claim 21, further comprising:

accumulating the number of on/off controls of said first semiconductor switch by a controller, and when the number of on/off controls reaches a predetermined number of times, said time control step performs an off control of said semiconductor switch.

* * * * *